US007824098B2

(12) United States Patent
Melamud et al.

(10) Patent No.: US 7,824,098 B2
(45) Date of Patent: Nov. 2, 2010

(54) COMPOSITE MECHANICAL TRANSDUCERS AND APPROACHES THEREFOR

(75) Inventors: Renata Melamud, Palo Alto, CA (US); Bongsang Kim, Albany, CA (US); Matthew Hopcroft, San Francisco, CA (US); Saurabh Chandorkar, Stanford, CA (US); Manu Agarwal, Stanford, CA (US); Thomas W. Kenny, San Carlos, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 66 days.

(21) Appl. No.: 12/017,228

(22) Filed: Jan. 21, 2008

(65) Prior Publication Data
US 2008/0204173 A1 Aug. 28, 2008

Related U.S. Application Data

(63) Continuation-in-part of application No. 11/446,568, filed on Jun. 2, 2006.

(60) Provisional application No. 60/881,338, filed on Jan. 19, 2007.

(51) Int. Cl.
*G01P 15/08* (2006.01)
*G01R 3/00* (2006.01)
*G01K 11/22* (2006.01)

(52) U.S. Cl. .............................. 374/117; 374/E11.011; 29/595; 73/504.16

(58) Field of Classification Search ................ 73/24.05, 73/504.04–504.16, 766, 777, 24.06, 862.59, 73/778; 331/176, 156, 154; 333/186–200; 374/117, E11.011; 29/595
See application file for complete search history.

(56) References Cited

U.S. PATENT DOCUMENTS

| 5,612,249 | A | * | 3/1997 | Sun et al. ..................... 438/297 |
| 5,772,322 | A | * | 6/1998 | Burns et al. .................. 374/118 |
| 6,119,518 | A | * | 9/2000 | Itou et al. ................. 73/504.16 |
| 6,278,337 | B1 | * | 8/2001 | Chan et al. .............. 331/116 M |
| 6,557,419 | B1 | | 5/2003 | Herb et al. |
| 6,831,525 | B1 | * | 12/2004 | Beaudin et al. ............. 331/176 |
| 6,987,432 | B2 | | 1/2006 | Lutz et al. |
| 7,071,793 | B2 | * | 7/2006 | Lutz et al. .................... 333/186 |
| 7,210,332 | B2 | * | 5/2007 | Kolosov et al. ................ 73/24.06 |
| 7,369,003 | B2 | | 5/2008 | Hagelin |

(Continued)

OTHER PUBLICATIONS

Candler et al. "Single Wafer Encapsulation of MEMS Devices" IEEE Transactions on Advanced Packaging. vol. 26, No. 3. Aug. 2003, pp. 227-232.*

(Continued)

*Primary Examiner*—Lisa M Caputo
*Assistant Examiner*—Jonathan Dunlap
(74) *Attorney, Agent, or Firm*—Crawford Maunu PLLC

(57) ABSTRACT

Mechanical transducers such as pressure sensors, resonators or other frequency-reference devices are implemented under conditions characterized by different temperatures. According to an example embodiment of the present invention, a combination of materials is implemented for mechanical transducer applications to mitigate temperature-related changes at or near a selected turnover temperature. In one application, a material property mismatch is used to facilitate single-anchor transducer applications, such as for resonators. Another application is directed to a Silicon-Silicon dioxide combination of materials.

30 Claims, 19 Drawing Sheets

DETF-Type Dual Resonator

SEM-View of Beam Section

U.S. PATENT DOCUMENTS

| | | | |
|---|---|---|---|
| 7,369,033 B2* | 5/2008 | Matsukawa et al. | 338/162 |
| 7,492,241 B2* | 2/2009 | Piazza et al. | 333/189 |
| 7,639,104 B1 | 12/2009 | Quevy et al. | |
| 2002/0047172 A1* | 4/2002 | Reid | 257/415 |
| 2003/0020565 A1* | 1/2003 | Cornett et al. | 333/197 |
| 2005/0162239 A1 | 7/2005 | Lutz et al. | |
| 2006/0261915 A1* | 11/2006 | Lutz et al. | 333/186 |
| 2006/0290449 A1* | 12/2006 | Piazza et al. | 333/187 |
| 2007/0013464 A1* | 1/2007 | Pan et al. | 333/200 |
| 2009/0160581 A1* | 6/2009 | Hagelin et al. | 333/200 |

OTHER PUBLICATIONS

Kim et al. "Frequency Stability of Wafer-Scale Encapsulated MEMS Resonators" Transducers '05, The 13th International Conference on Solid-State Sensors, Actuators and Microsystems. Jun. 5-9, 2005.*

Hopcroft et al. "Active Temperature Compensation for Micromachined Resonators" Solid-State Sensor, Actuator and Microsystems Workshop. Jun. 6-10, 2004.*

B. S. Berry et al. "Temperature Compensation for Constant-Frequency Electromechanical Oscillators." IBM Technical Bulletin XP-002462194, vol. 14, No. 4 (Sep. 1971), pp. 1237-1238.

H.J. Mcskimin. "Measurement of Elastic Constants at Low Temperatures by Means of Ultrasonic Waves—Data for Silicon and Germanium Single Crystals, and for Fused Silica." *Journal of Applied Physics*. Aug. 1953. vol. 24, No. 8. Aug. 1953, pp. 988-997.

M. B. Othman et al. "Electrothermally Excited Silicon Beam Mechanical Resonators." *Electronics Letters*. Jul. 2, 1987. vol. 23, No. 14, pp. 728-730.

R. Sandberg et al. "Temperature and pressure dependence of resonance in multi-layer microcantilevers." *Journal of Micromechanics and Microengineering*. Jun. 6, 2005. vol. 15, pp. 1454-1458.

F. Shen et al. "Thermal Effects on coated resonant microcantilevers." *Sensor and Actuators*. 2001. A-95, pp. 17-23.

http://en.wikipedia.org/wiki/Elastic_modulus. "Elastic modulus." Wikipedia®, 1 pg., Jan. 17, 2009.

Kim et al. "Si-Si02 Composite MEMS Resonators in CMOS Compatible Wafer-scale Thin-Film Encapsulation." Frequency Control Symposium 2007, IEEE International. Oct. 1, 2007, pp. 1214-1219.

Tarr, Martin. "Coefficient of Thermal Expansion." Mar. 22, 2005, 3 pgs.

* cited by examiner

COMPOSITE MECHANICAL TRANSDUCERS AND APPROACHES THEREFOR

RELATED PATENT DOCUMENTS

This patent document claims benefit under 35 U.S.C. §119 to U.S. Provisional Patent Application No. 60/881,338, entitled "Temperature Compensated Transducer with Controlled Turnover Temperature" and filed on Jan. 19, 2007; this patent document is also a continuation-in-part of U.S. patent application Ser. No. 11/446,568, entitled "Composite Mechanical Transducers and Approaches Therefore" and filed on Jun. 2, 2006; all of these documents, and any references cited therein, are fully incorporated herein by reference.

FEDERALLY-SPONSORED RESEARCH OR DEVELOPMENT

The invention was made with Government support under contract N66001-03-1-8942 awarded by the Space and Naval Warfare Systems Center. The Government has certain rights to this invention.

FIELD OF THE INVENTION

The present invention relates generally to mechanical transducers, and more particularly to temperature compensation with mechanical transducers.

BACKGROUND

Heat can be an important issue in a variety of mechanical transducer applications, including electrical applications, pressure sensors, resonator structures and other frequency-reference devices. For example, in semiconductor applications, circuits often generate a significant amount of heat due to a variety of operational conditions, physical conditions (e.g., close proximity, lack of cooling) and other conditions. Such heat can introduce a variety of undesirable operational conditions, introducing performance and reliability issues. In addition, variation in temperature, whether via heating or cooling, can affect the operating temperature of devices and, accordingly, the performance thereof.

One type of electrical application subject to such temperature-related conditions involves resonators. For instance, the mechanical resonant frequency of devices constructed from Silicon varies with temperature. Accordingly, resonators implementing Silicon have experienced temperature-related changes in resonant frequency.

In many resonator applications, a variety of approaches have been implemented for addressing, controlling or otherwise compensating for temperature. Generally, temperature compensation methods for resonators have been classified as active or passive. Many active compensation techniques use power in order to reduce the temperature coefficient of frequency (TCF) into the desirable range. For instance, voltage has been applied to alter the resonant frequency of a resonator. Passive compensation approaches have used non-powered approaches to tune the resonant frequency of resonator materials, such as those involving the introduction of different materials to a particular type of resonator.

While previous approaches to addressing heat (and temperature) related issues have been implemented, controlling or otherwise compensating for temperature changes in resonators continues to be challenging. For example, approaches involving the introduction of materials with mismatched TCE's may introduce stress induced hysteresis, processing difficulties due to large thermal stresses, restrictions on material selection for clean processes and CMOS compatibility, and undesirable sensitivity to package stress.

These and other characteristics have been challenging to the implementation and manufacture of resonators.

SUMMARY

The present invention is directed to overcoming the above-mentioned challenges and others related to the types of applications discussed above and in other applications. These and other aspects of the present invention are exemplified in a number of illustrated implementations and applications, some of which are shown in the figures and characterized in the claims section that follows.

Various aspects of the present invention are applicable to the implementation of materials having different materials to facilitate temperature compensation with resonators, to selectively set (e.g., tune) the resonant frequency and/or stiffness of resonant structures, as relevant to a temperature or temperature range.

According to an example embodiment of the present invention, a mechanical transducer arrangement includes first and second materials exhibiting respective TCE (temperature coefficient of Young's Modulus) and arranged in relative quantity and position, as a function of their respective TCE values, to form a structure that facilitates a selected turnover temperature (TOT) of the composite resonant structure. This approach may involve, for example, setting the structure's composition and arrangement to mitigate fluctuation in mechanical stiffness over a temperature range. With this approach, the structure behaves relatively independent from temperature over a small temperature range around (and including) the TOT.

According to another example embodiment of the present invention, a resonant structure includes a structural material and a compensation material. The structural material is susceptible to temperature-related fluctuation in resonant frequency. The compensation material is coupled to the structural material and has a TCE, shape and arrangement, relative to the structural material, that passively mitigate temperature-related fluctuation in resonant frequency exhibited by the structural material. In some applications, the TCE, shape and arrangement of the compensation material are such that a composite structure including the structural material and the compensation material exhibits a TCF that is generally stable (e.g., at zero or other selected value) over a temperature range.

In another example embodiment of the present invention, a resonator arrangement includes a composite resonant structure exhibiting a consistent resonant frequency over temperature. The resonant structure includes first and second materials each having a composition, shape and respective TCE, arranged relative to one another, to passively mitigate temperature-related fluctuation in resonant frequency. An anchor couples the resonant structure to an underlying substrate over which the resonant structure extends (e.g., in a cantilever-type arrangement). An electrical circuit is arranged and coupled to the resonant structure to apply a bias thereto. The resonant structure responds to the bias by resonating at a resonant frequency that is substantially consistent over an operational temperature range of the resonator arrangement.

According to another example embodiment of the present invention, a mechanical transducer is manufactured in a manner that facilitates passive mitigation of fluctuation in mechanical stiffness of the transducers. A structural material susceptible to temperature-related fluctuation in mechanical stiffness is formed. A compensation material is coupled to the structural material, such as by forming the compensation material on or around the structural material, or forming the compensation material immediately adjacent thereto. The TCE, shape and arrangement of the compensation material are selected relative to the structural material to passively mitigate the temperature-related fluctuation in mechanical stiffness exhibited by the structural material. In some applications, the TCE, shape and arrangement of the compensation material are selected to create a resultant composite structure with the structural material exhibiting a TCF that is generally stable (e.g., at zero or other selected value) over a temperature range.

The above summary is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings in which.

Figure 1:
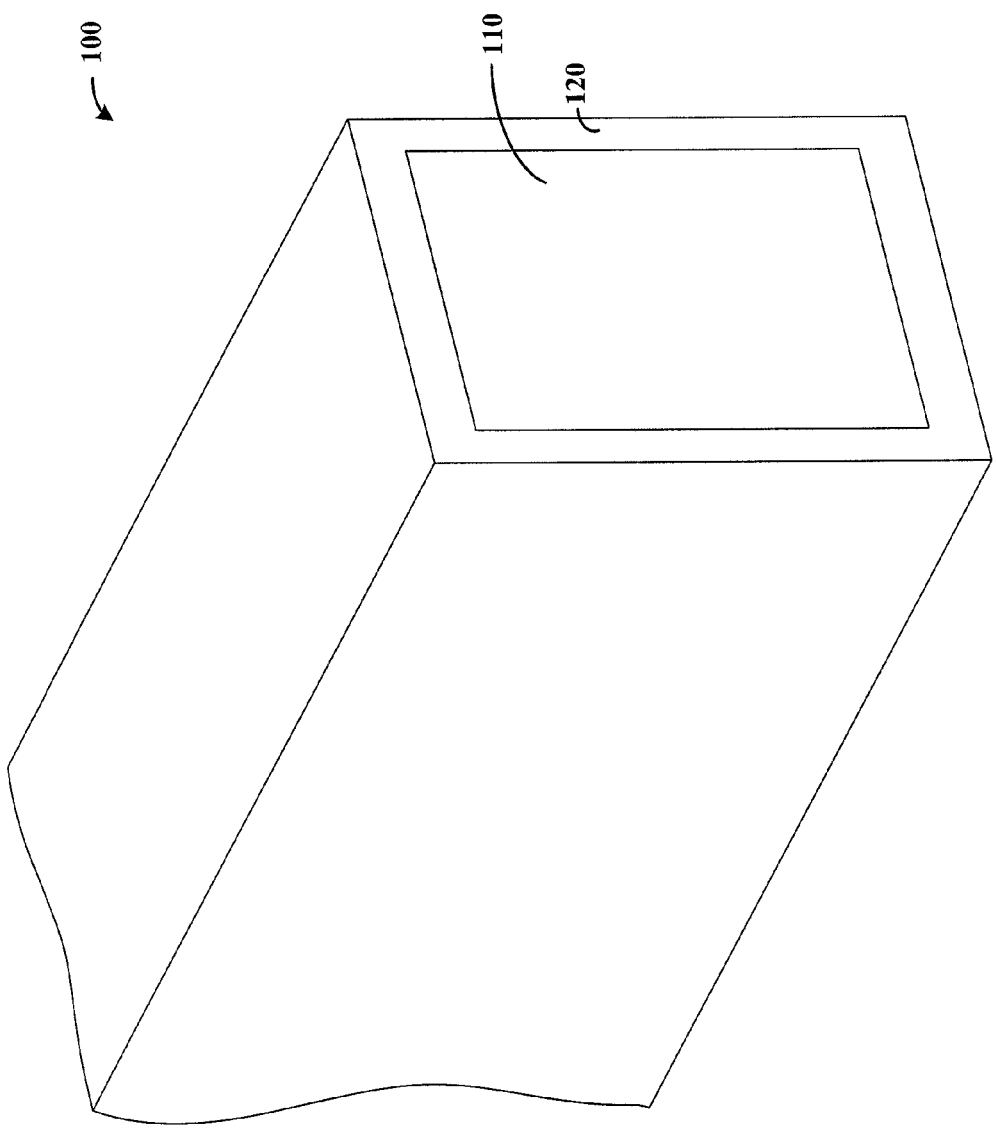
FIG. 1 shows a cross-sectional view of a composite resonant structure, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of devices and processes, and the invention has been found to be particularly suited for implementation with mechanical transducers such as resonators, other frequency-reference devices or pressure sensors. While the present invention is not necessarily limited to such applications, various aspects of the invention may be appreciated through a discussion of examples using this context.

In connection with various example embodiments of the present invention, a temperature compensation approach involves the use of a material property mismatch in single-anchored resonators. The material properties of resonators, including the composition and arrangement of materials that are used to make the resonators, are set to facilitate a temperature or temperature range over which the resonator operates at a relatively consistent frequency. In some applications, this approach involves setting a turnover temperature (TOT), or a temperature range, for the resonator so that the resonator exhibits a frequency response that is relatively flat at the selected turnover temperature or temperature range. This flat response can be implemented to correspond to a relatively consistent mechanical stiffness exhibited by the resonator over the temperature range including the TOT.

In connection with other example embodiments of the present invention, a resonator is made from a combination of materials such as Si and $SiO_2$ to exhibit a temperature coefficient of frequency (TCF) that is the result of the combination of the softening of one material and the hardening of the other material. For example, one embodiment is directed to the formation of $SiO_2$ on the outside surface of a Si beam, after it has been released within an encapsulation, where the encapsulation is completed after formation of the $SiO_2$. Such an approach can be used to form a single-anchored resonator that mitigates and/or cancels the linear ($1^{st}$ order) temperature TCF response over a particular temperature range. At this temperature range, the frequency variation of the resonator is at or near zero. With this approach, the resonator exhibits frequency stability over a selected temperature range.

According to another example embodiment of the present invention, a composite mechanical transducer structure includes a combination of materials selected and arranged to facilitate substantially consistent mechanical stiffness and/or resonant frequency over a temperature range (e.g., a range that is within a few, ten or twenty degrees of a turnover temperature TOT). In one application, the mechanical transducer includes at least two materials having respective TCE values (temperature coefficient of Young's Modulus values) that are opposite in sign. The amount, thickness and relative placement of the at least two materials are selected to achieve a resultant structure that exhibits relatively consistent mechanical stiffness over a predetermined temperature range (e.g., relative to a variation in mechanical stiffness of one of the at least two materials over temperature). For instance, where the mechanical transducer is a resonant structure, the relatively consistent mechanical stiffness facilitates a resonant frequency of the structure that is correspondingly stable over the temperature range. In some applications, the resultant TCF of the composite structure is substantially consistent (e.g., varies less than about 1 ppm/° C.) over a desired value configured for a predetermined temperature range, and in other applications, the TCF is substantially zero (e.g., in a range of −1 to +1), and/or set to a desired value. In this regard, the mechanical stiffness of the resonant structure is generally stabilized over a temperature range (e.g., over a predetermined temperature range, for example a temperature range which is common for electrical device applications, such as between about 0° C. and +70° C., or for other applications, such as −50° C. to +85° C.).

According to another example embodiment of the present invention, the native TCF of a resonator material is controlled and/or substantially reduced (i.e., in absolute value) via a composite material including the resonator material and a compensation material. In some contexts, native refers to that exhibited by a single ordinary material, such as quartz, silicon, or other materials. The compensation material exhibits a TCE value that is opposite in sign, or otherwise different in TCE value from the resonator material. In some applications, the TCF of the composite resonator is substantially reduced to about half of the TCF of the resonator material, and in other applications, substantially reduced to less than about 1 ppm/° C. The resonator exhibits a bending stiffness that has reduced sensitivity to temperature relative, for example, to the resonator material (e.g., a Silicon-based resonator). In one implementation, the composite material includes a first material that exhibits softening with increasing temperature and a second material that exhibits hardening with increasing temperature (e.g., exhibits hardening).

In one implementation, a resonant structure includes a Silicon—Silicon Dioxide ($Si$—$SiO_2$) composite structure that exhibits softening with increasing temperature and Silicon dioxide material that exhibits hardening with increasing temperature. In one application, the Silicon dioxide material is on an outer portion of the Silicon. In another application, the Silicon dioxide substantially surrounds the Silicon (e.g., where the Silicon dioxide is formed on an outer wall of the Silicon). In still another application, the Silicon dioxide is inside or otherwise within the Silicon. For example, the silicon and silicon dioxide may be arranged in one or more layers vertically or laterally throughout the cross-section of the resonator, where the position and thicknesses of the layers are selected so as to reduce and/or minimize the TCF over a predetermined temperature range, or to achieve a predetermined TCF value over a predetermined temperature range.

According to another example embodiment of the present invention, a single-anchored resonator is implemented with a composite material exhibiting characteristics as described with the $Si$—$SiO_2$ material above. A portion of the resonator is anchored to an adjacent material (e.g., an adjacent substrate) and another portion of the resonator is suspended over the adjacent material, supported via the anchor. With such applications, the single-anchor approach mitigates the coupling of stresses in the resonator with stresses in the substrate or other material to which the resonator is coupled.

In another example embodiment of the present invention, a resonant structure using two materials to facilitate a near-zero TCF is controlled to mitigate drift. In some applications, such drift is frequency drift associated with temperature over time. In other applications, such drift is attributed to the migration of absorbents off of the resonant structure. In the latter application, the drift is mitigated using, for example, electrical and/or heat application to the resonant structure.

In another example embodiment of the present invention, composite resonators are fabricated in a wafer-scale encapsulation process, according to another example embodiment of the present invention. A resonant structure is etched from a substrate such as silicon, exposing a suspended portion of the resonant structure having a first type of material within the substrate. A second type of material is formed on the suspended portion of the resonant structure such that the first and second materials facilitate a relatively consistent resonant frequency of the structure over temperature (e.g., relative to the variation in resonant frequency of one of the at least two materials over temperature). The second material may be formed using, for example, a deposition approach such as chemical vapor deposition (CVD) or oxidation. In some applications, the first and second materials are arranged to facilitate a resultant TCF of the resonant structure that is near zero over a predetermined temperature range. Alternatively, the first and second materials may be arranged to facilitate a resultant TCF to a predetermined value that is substantially different from zero over a predetermined temperature range. After the second material is formed, the exposed suspended resonant structure is sealed, leaving an open area adjacent the resonant structure (e.g., with the open area being a vacuum or near-vacuum, or containing a gas or mixture of gasses).

In some applications, one or more of the above manufacturing approaches, or those otherwise implemented in connection with the manufacture of the devices described herein, involve resonator encapsulation as part of a micro-electro-mechanical systems (MEMS) fabrication process in which the resonator is part of a larger system. The resonator is formed with a composite $Si/SiO_2$ structure, where the oxide ($SiO_2$) growth is initiated after the resonator is released from other silicon (e.g., the silicon is etched to release unanchored portions of the resonator). An oxide etch step is carried out after the $SiO_2$ growth to remove oxide from the surface of material that encapsulates the resonator.

Turning now to the figures, FIG. 1 shows a cross-sectional view of a composite resonant structure 100, according to an example embodiment of the present invention. The composite resonant structure 100 includes at least two materials 110 and 120, with the material 120 formed on an outer portion of the material 110. Each of the materials 110 and 120 exhibit a TCE (Temperature Coefficient of Young's Modulus) that contributes to characteristics of the resonant structure 100 that facilitate generally consistent resonant performance over temperature (e.g., over a particular temperature range including a turnover temperature (TOT)). In some applications, the TCE of the material 110 is opposite in sign to the TCE of the material 120. The quantity and arrangement of the materials 110 and 120 is such that the composite resonant structure 100 exhibits a relatively low TCF (temperature coefficient of frequency), and in some applications, a TCF near zero.

While shown in a generally rectangular beam-type shape, the cross-sectional shape of one or both of the materials 110 and 120 are varied to suit different applications. For instance, other polygons, ovals, circles or irregular shapes are implemented for a variety of approaches. The shape, as well as quantity and relative arrangement of the materials 110 and 120, are considered in achieving a desirable TCF.

In addition, the approaches described with FIG. 1 and otherwise herein are selectively implemented with a variety of types of resonators, such as bulk resonators, resonators that exhibit other modes (e.g., wine glass or breathing modes), with modes of vibration not limited to flexural bending. In some applications, the top view of these resonator types are circular or rectangular disk-shaped. Resonant device may include, for example, resonant sensors, electro-mechanical filters or other devices whose performance depends upon the mechanical stiffness of its structures.

In one implementation, the composite resonant structure 100 is adapted for single-anchored applications (e.g., with a single portion or end of the structure 100 anchored to a base or other structure, for example the substrate). The following discussion involves one approach to achieving such a TCF with a single-anchored application employing a beam-type resonator as shown in FIG. 1.

Flexural mode beam-type resonators that are fabricated from a single material and are single-anchored have a frequency and TCF described in Equations 1A and 1B, with Equation 1B ignoring the smaller effect of dimensional changes with temperature and assuming linear material properties.

$$f = \frac{\beta^2}{2\pi L^2}\sqrt{\frac{B}{\rho A}} = \frac{\beta^2}{2\pi L^2}\sqrt{\frac{EI}{\rho A}} \qquad \text{(Equation 1A)}$$

$$TCF = \frac{1}{f_o}\frac{\partial f}{\partial T} \approx \frac{1}{2}\frac{\partial f}{\partial B}\frac{\partial B}{\partial T} \approx \frac{TCE}{2} \qquad \text{(Equation 1B)}$$

In the above equations, $\beta$ is the mode constant, E is the Young's Modulus, $\rho$ is the density of the material, I is the flexural rigidity (or second moment of inertia), L is the length of the beam, A is the cross sectional area of the beam, B=EI is defined as the bending stiffness of the beam, $f_o$ is a reference (or desired operating) frequency, and TCE is the temperature coefficient of Young's modulus of the beam's material.

For a composite beam of N materials such as the resonant structure 100 in FIG. 1, the above equations are modified such that the bending stiffness takes into account the geometric composition of the beam, wherein $$B = \sum_{j=1}^{N} E_j I_j \text{ and} \qquad \text{(Equation 2A)}$$

$$TCF \approx \frac{1}{2}\left[\sum_{j=1}^{N} E_j I_j TCE_j \Big/ \sum_{j=1}^{N} E_j I_j\right] \qquad \text{(Equation 2B)}$$

The resulting TCF of the composite resonant structure 100 is a function of the TCE of each of the materials 110 and 120, as well as their quantity and arrangement. For example, the materials 110 and 120 may be arranged in a series of alternating layers from top to bottom, or from left to right, where the thicknesses and arrangements of the layers are selected to achieve a predetermined TCF over a predetermined temperature range.

In one implementation, the material 110 is Silicon and the material 120 is $SiO_2$, with the $SiO_2$ formed via oxidation of the Silicon surface, or otherwise deposited on the surface of the Silicon. The TCE of Silicon is approximately –60 ppm/° C. which results in a TCF of –30 ppm/° C. for Silicon resonators. The $SiO_2$, which has a positive TCE of +195 ppm/° C., in combination with Silicon facilitates a bending stiffness of the composite resonant structure 100 that is generally consistent over temperature, yielding an (about) zero TCF resonator.

Referring to Equation 2B above, a design parameter that can be controlled is the flexural rigidity (I) of each material in a particular resonant structure. For a Si—$SiO_2$ composite beam as in the above example discussed in connection with FIG. 1, the $SiO_2$ growth of the material 120 is implemented to achieve a low or near-zero TCF.

As relevant to the above example involving a composite structure of Silicon and amorphous $SiO_2$, a variety of other material combinations are implemented in a similar manner with two or more materials making up a composite structure. For instance, one or more of Germanium Oxide, Silicon nitride, aluminum nitride and hafnium oxide are selectively used with such a structure in place of and/or in addition to $SiO_2$ as a temperature-compensating material. Similarly, other materials such as single-crystal semiconductor materials, CMOS type materials, clean process materials, Silicon-Germanium (SiGe), Silicon, quartz and Germanium Arsenide (GeAs) are selectively used with such a structure in place of and/or in addition to Silicon. In some applications, one or more such materials are implemented in a resonator having a non-zero TCF.

In various embodiments, the approaches described above are implemented to design and manufacture a resonant structure exhibiting a turnover temperature (TOT) near which the frequency response of the resonator to changes in temperature are near zero. This approach is effected by setting the materials of a composite structure to facilitate mechanical stiffness as described above, using the above equations for a desired TOT, according to the properties of the material used to make the resonant structure at the TOT.

Figure 2:
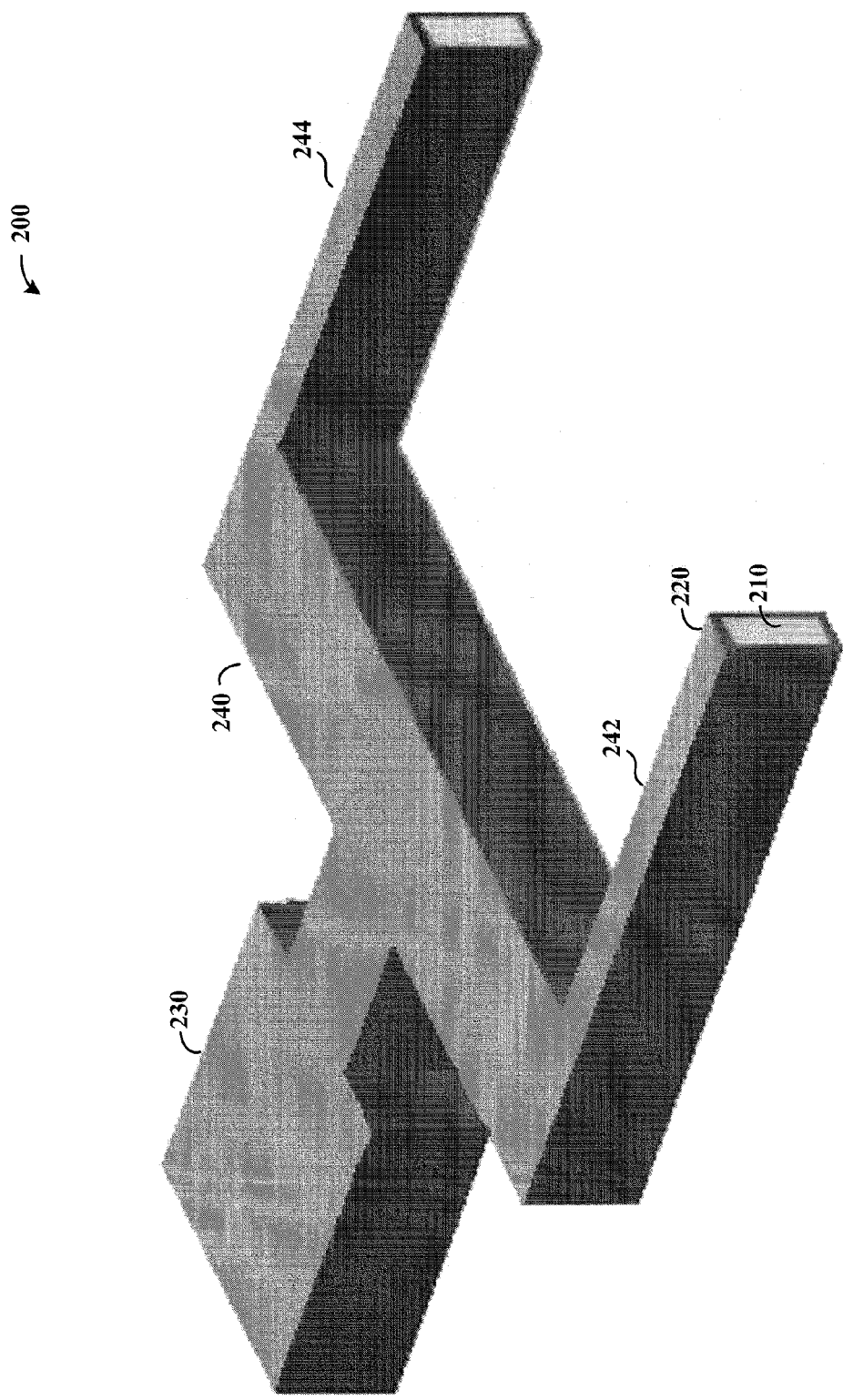
FIG. 2 shows a resonator arrangement, according to another example embodiment of the present invention.

FIG. 2 shows a double-ended tuning fork (DETF) resonator arrangement 200, according to another example embodiment of the present invention. The arrangement 200 includes an anchor region 230 for coupling to a support structure such as a substrate underlying the arrangement 200, a lateral structure portion 240 and two composite beams 242 and 244. In each of these embodiments, the resonating structure is connected to the substrate at a single location. By anchoring the device at a single location, thermal expansion of the substrate, or other strains applied to the substrate by package materials or other external influences do not introduce stresses into the resonator that might cause additional changes in frequency.

The composite beams 242 and 244 each include an inner material 210 and an outer material layer 220 on the inner material. This arrangement may be implemented in a manner similar to that shown in FIG. 1 and discussed above, and to achieve a desirable turnover temperature (TOT) to meet certain ambient operating conditions, or to meet known heated or cooled operating conditions. Each of the inner and outer materials 210 and 220 have respective TCE characteristics that contribute to a resultant TCF of the respective beams 242 and 244 that facilitates desirable resonant behavior over a predetermined range of temperatures, and in some applications, that is a zero or near-zero TCF (i.e., set to a selected value for a particular application).

In some applications the inner material may have a positive TCE and the outer material may have a negative TCE. Alternatively, the inner material may have a negative TCE, and the outer material may have a positive TCE. The position of the positive and negative TCE materials and the relative thickness of these two materials are selected so as to achieve a TCF substantially near zero over a predetermined temperature range. Alternatively, the position and thickness of the positive and negative TCF materials can be selected to achieve a TCF that is substantially different from zero within a predetermined temperature range.

Generally, each composite beam has a quartic dependence on thickness of the outer material layer 220. In this regard, the TCF of the composite beams 242 and 244 depends upon the thickness of the outer material 220, and the flexural rigidity (I) of the materials relates to the resultant TCF as discussed above and is sensitive to the thickness of the material.

In one implementation involving the DETF resonator arrangement 200, the inner material 210 of the composite beams 242 and 244 is a Silicon material such as crystalline silicon, polycrystalline silicon, or amorphous silicon, and the outer material layer 220 is SiO$_2$ coated on the Silicon 210 by oxidation of surfaces thereof. The flexural rigidity of the SiO$_2$ material (I$_{SiO_2}$) is given as $$I_{SiO_2} = \frac{(h+2t)(w+2t)^3}{12} - \frac{hw^3}{12}, \quad \text{(Equation 3)}$$

wherein
t=thickness of the SiO$_2$,
w=width of the Silicon beam material 210, and
h=height of the Silicon beam material 210.

Figure 7:
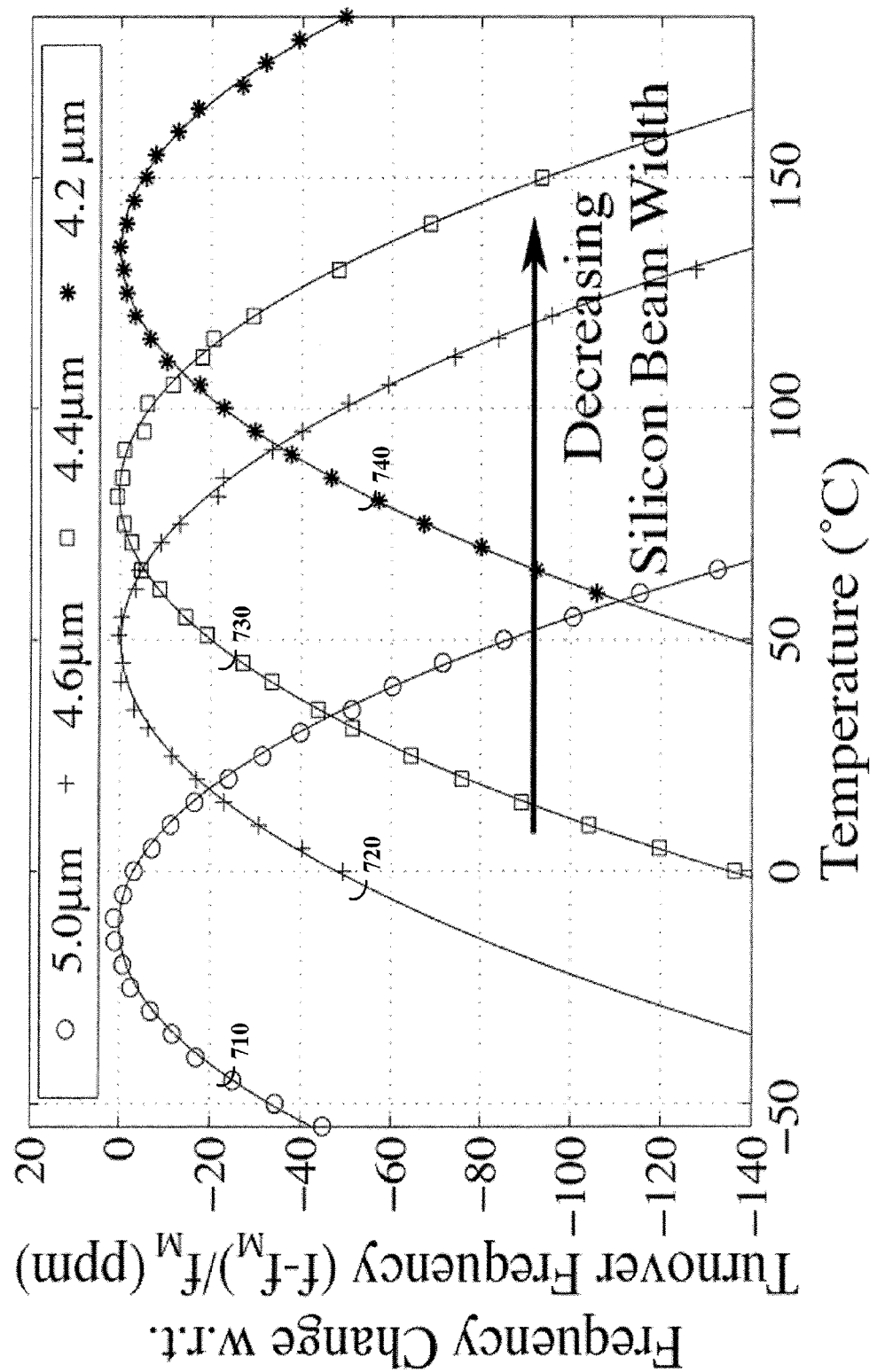
FIG. 7 shows plots of temperature versus frequency change for resonators, in accordance with various example embodiments of the present invention.

In some applications, the geometry of the inner (e.g., Si) material 210 and outer material layer 220 (e.g., SiO$_2$) elements of the beam resonator are set to cancel the linear temperature dependence of frequency at a particular temperature, thereby creating a resonator arrangement 200 having a turnover temperature or inflection temperature. In this context, the turnover temperature is a temperature at which the frequency does not vary with temperature (e.g., the frequency exhibits little to no variation over a small temperature range). The geometry of the Si and SiO$_2$ portions 210 and 220, as well as the actuation method for the resonator arrangement 200, are selected to impact the temperature at which the linear TCF is canceled. By controlling the composition of the Si and SiO$_2$, the turnover temperature is modified. Various example embodiments relevant to this approach are shown in FIG. 7 and discussed below.

Figure 3:
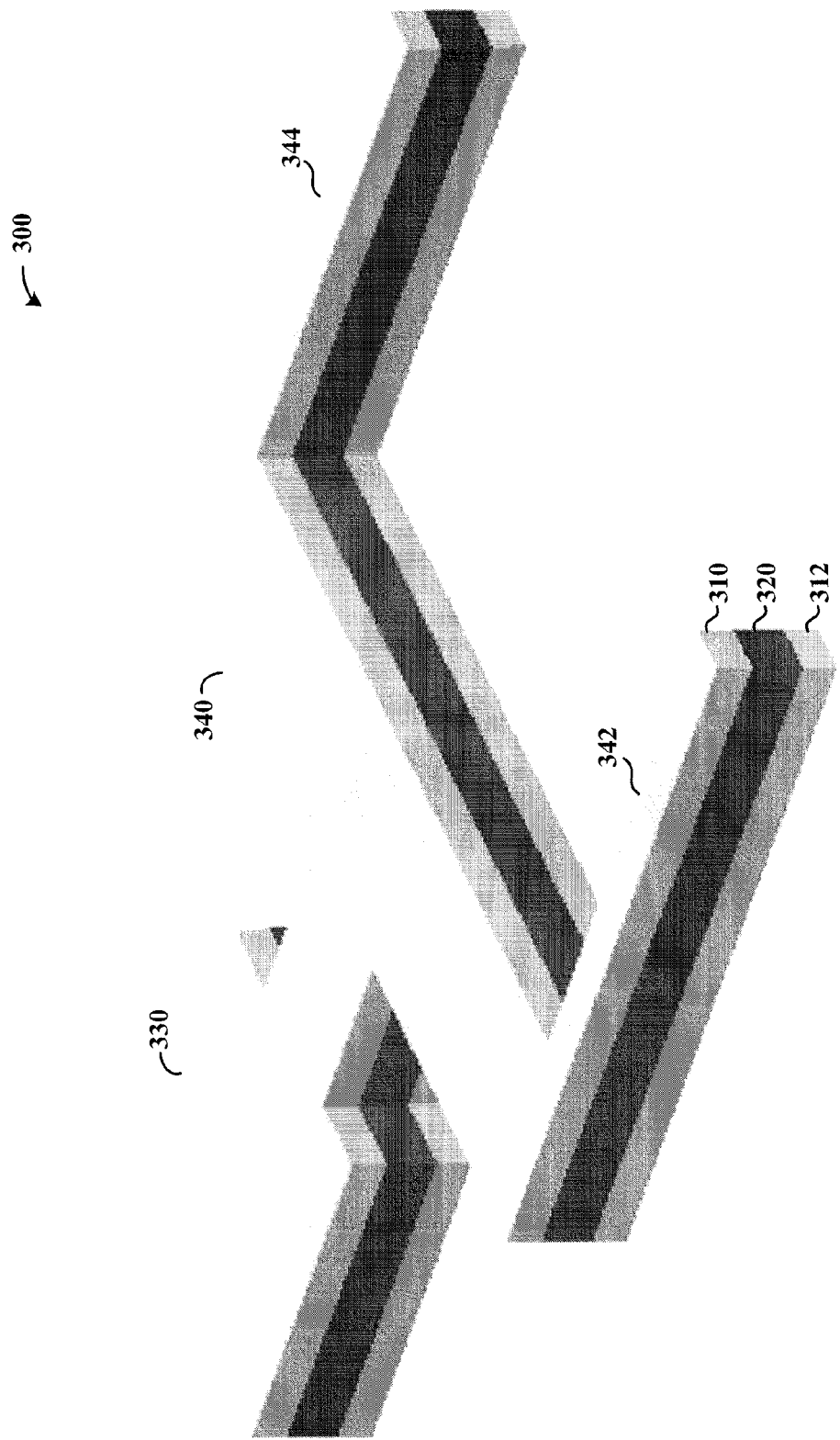
FIG. 3 shows a resonator arrangement, according to another example embodiment of the present invention

FIG. 3 shows a DETF resonator arrangement 300, according to another example embodiment of the present invention. The arrangement 300 is similar in shape to the DETF resonator arrangement 200 in FIG. 2, with a single base or anchor region 330 for coupling to a support structure, a lateral structure portion 340 and two composite beams 342 and 344 (labeled similarly to the arrangement 200 of FIG. 2 for discussion purposes).

The composite beams 342 and 344 each include an inner material 320 between two outer material layers 310 and 312. The inner (320) and outer materials (310, 312) form a laminate-type structure exhibiting a flexural rigidity that is linearly related to the thickness of each layer (e.g., defined in a vertical direction as shown in FIG. 3). In some applications, the TCF of the composite beams 342 and 344 is selectively set via the thickness of the inner material 320; in other applications, different characteristics of the composite beams are modified (e.g., while holding the thickness and/or other characteristics constant) to set the TCF of the composite beams.

In one implementation involving the DETF resonator arrangement 300, the outer material 310 and 312 of the composite beams 342 and 344 is a Silicon material, and the inner material 320 is SiO$_2$. The flexural rigidity of the SiO$_2$ material (I$_{SiO_2}$) is given as $$I_{SiO_2} = \frac{tw^3}{12}, \quad \text{(Equation 4)}$$

wherein
t=thickness of the SiO$_2$, and
w=width of the beam.

Figure 4:
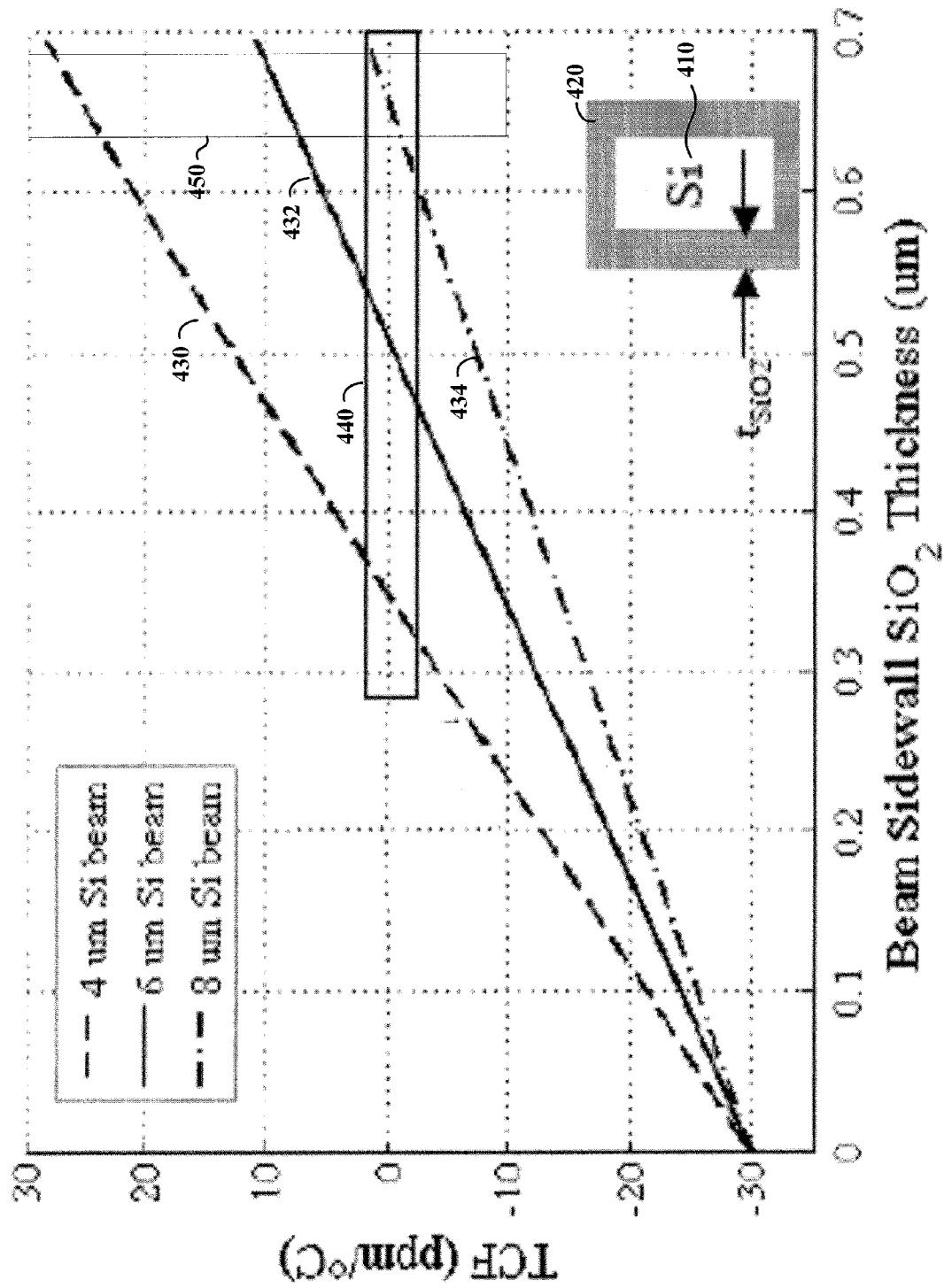
FIG. 4 shows a graphical approach to selecting and implementing material thickness in a rectangular-profile resonator beam arrangement, according to another example embodiment of the present invention.

FIG. 4 shows a graphical approach to selecting and implementing material thickness in a rectangular resonator beam arrangement using Silicon as a base material and SiO$_2$ as a coating, according to another example embodiment of the present invention. The approach shown in FIG. 4 is applicable, for example, to a resonant structure such as that shown in FIG. 1, with the materials 410 (Silicon) and 420 (SiO$_2$) in FIG. 4 respectively corresponding to the materials 110 and 120 in FIG. 1.

The graph in FIG. 4 shows beam sidewall thickness (material 420), here implemented with SiO$_2$, with beam sidewall thickness (of the SiO$_2$ material 420) in micrometers on the horizontal axis, and TCF (ppm/° C.) on the vertical axis. Three plots 430, 432 and 434 are shown, respectively with 4, 6 and 8 micrometer silicon beams (material 410). The plots 430, 432 and 434 are obtained using Equation 2B. The target oxidation (thickness of SiO$_2$) depends on the initial width of the Silicon 410.

In one embodiment, for the case of a silicon beam with a silicon dioxide coating, silicon dioxide coating is formed on all surfaces with thickness that is between 5% and 10% of the width of the silicon beam, resulting in a resonator TCF that is substantially near zero about a predetermined temperature range. In another embodiment, a silicon dioxide coating that is more than 10% of the width of the silicon beam is formed on all surfaces, resulting in a resonator TCF that is positive and substantially greater than zero over a predetermined temperature range. In another embodiment, a silicon dioxide coating that is less than 5% of the width of the silicon beam is formed on all surfaces, resulting in a resonator TCF that is negative and substantially less than zero over a predetermined temperature range. Controlling the ratio of the oxide thickness relative to the silicon thickness allows formation of the resonators that have TCF substantially near zero (e.g., a TCF value between about ±1 of 0) over a predetermined temperature.

In one example embodiment, a resonator with a final oxide film thickness that is 8.5% of the final silicon beam width is implemented for a resonator with a TCF substantially near zero. In some applications, a resonator with a predetermined ratio of oxide film thickness to silicon beam width, is fabricated by etching a silicon beam in a functional layer of the device with an initial width that is slightly greater than the predetermined final silicon beam width, and allowing for the consumption of some amount of the silicon by the formation of the oxide in an oxidation process.

The plots 430, 432 and 434 address the orientation-dependent oxidation of the beam surfaces (of Silicon 410) as well as the consumption of Silicon during oxidation (e.g., about 0.46 μm of Silicon for 1 μm of SiO$_2$). In addition, the constants used in FIG. 4 with Equation 2B are:
TCE$_{Si}$=−60 ppm/° C.,
TCE$_{SiO_2}$=+195 ppm/° C.,
E$_{Si}$=168 GPa,
ESiO$_2$=70 GPa, and
h=20 μm.

Continuing to refer to FIG. 4, a region 440 corresponds to a thickness or thickness range of the SiO$_2$ material 420 (t$_{SiO_2}$) that facilitates a predetermined TCF of the beam that is substantially zero TCF of the beam (e.g., a TCF near zero for a temperature range of −50° C. to +200° C.), in connection with certain example embodiments. This approach can be used to set TCF performance at or near a particular turnover temperature (TOT) as well, in a manner similar to that described above. For other embodiments, a region 450 corresponds to resonators fabricated with silicon beam widths ranging from about 3 microns to 10 microns, and with silicon dioxide thickness of between 0.64 and 0.69. Resonators fabricated in a manner commensurate with region 450 include those having a TCF substantially near zero for some applications, and for other applications, resonators with TCF values ranging from about 5 ppm/° C. to more than 25 ppm/° C., formed adjacent to one another at the same time in the same fabrication process.

In another example embodiment, two or more resonators are fabricated adjacent to each other in a single wafer. In some applications, these resonators are manufactured and arranged to produce groups of resonators with substantially equal TCF and frequency values over a predetermined range of temperatures. In other applications, these resonators are manufactured and arranged to produce resonators with different values of TCF over a predetermined range of temperatures. For example, by fabricating sets of resonators with two different silicon widths, and by growing the same oxide film thickness on all resonators, the resultant devices will have two different TCFs. In one particular example, the widths are 8 and 4 microns, and the oxide thickness is 0.35 microns and the resultant TCFs are near 0 ppm/° C. and near −15 ppm/° C. for the 8 and 4 micron beams respectively. By selecting the two beam widths and the oxide film thickness, adjacent resonators are fabricated with the substantially different TCF values.

FIGS. 5A-5G show a resonator arrangement 500 at various stages of manufacture using a wafer scale epitaxial polysilicon encapsulation (e.g., thin film encapsulation, or layered encapsulation) with oxide seal processes, according to another example embodiment of the present invention. These stages and the related manufacturing approaches are used to manufacture one or more resonators, such as an array of resonators, in a semiconductor wafer. These approaches are also readily integrated with wafer processing techniques, such as silicon processing techniques, for manufacturing a variety of devices, and may incorporate additional circuitry to be used with the resonator structures for particular applications.

Figure 5A:
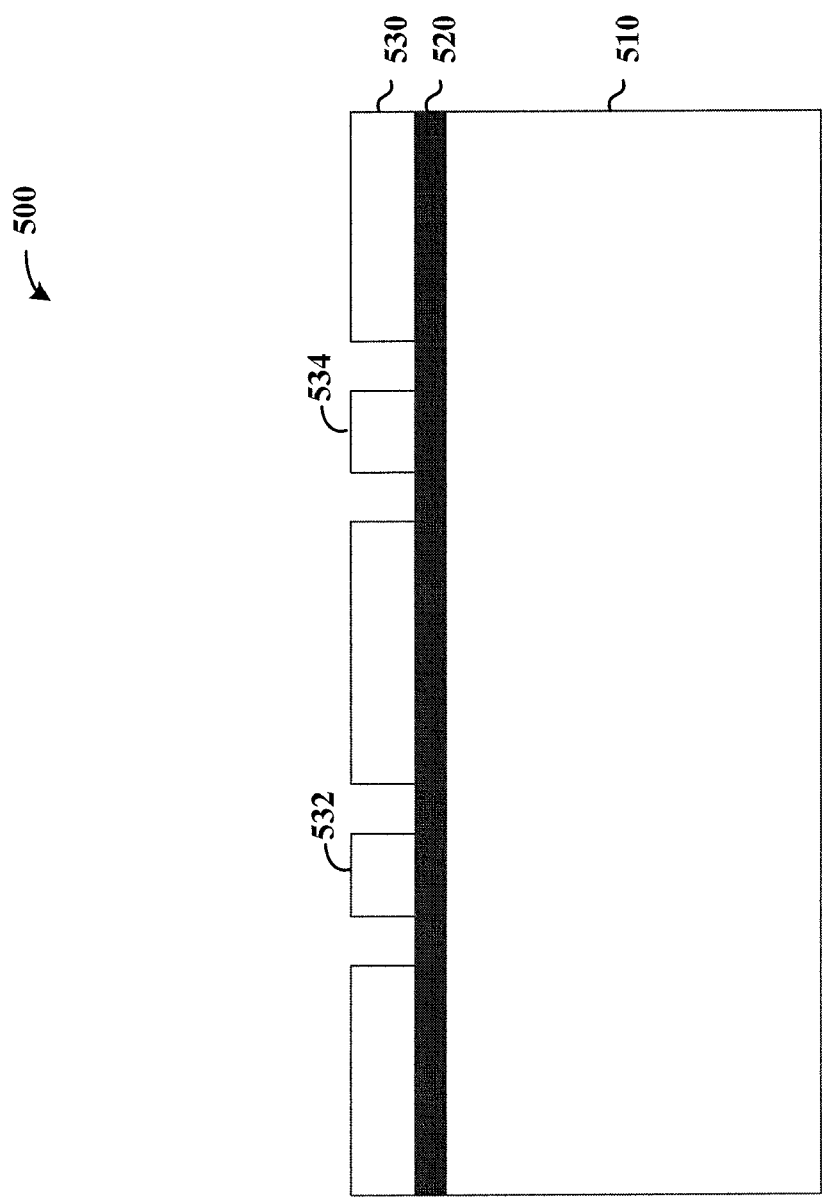
FIG. 5A-5G show a resonator at various stages of manufacture, according to another example embodiment of the present invention.
Figure 5B:
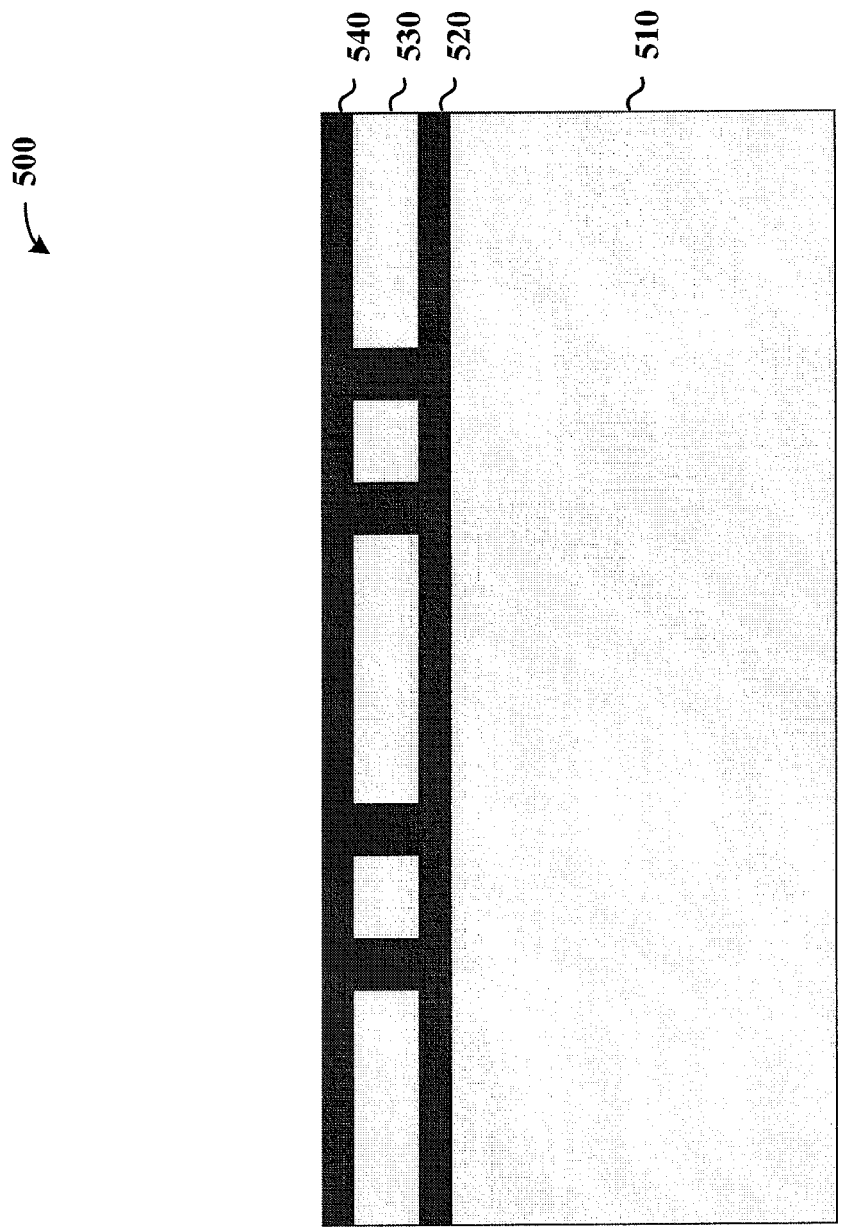

Beginning with FIG. 5A, a silicon wafer 510 has a SiO$_2$ layer 520 formed thereon, with a Silicon layer 530 formed on the SiO$_2$ layer patterned to define vertical sidewalls of resonator structures 532 and 534 of the Silicon (for formation as resonant beams similar to that shown in FIG. 1). The exposed regions near the sidewalls of resonator structures 532 and 534 are filled with a SiO$_2$ material 540 in FIG. 5B, which is also formed over the resonator portions and the remaining Silicon layer 530.

Figure 5C:
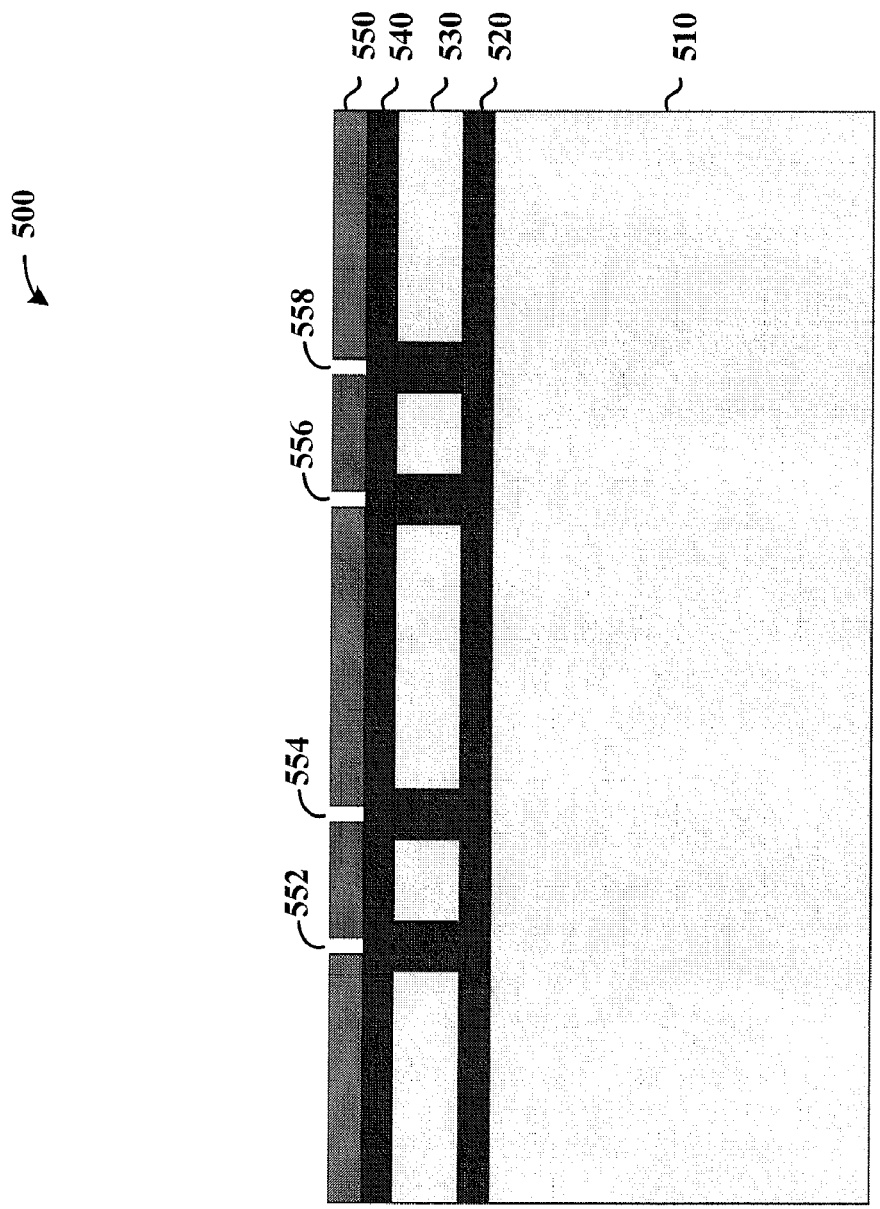
Figure 5D:
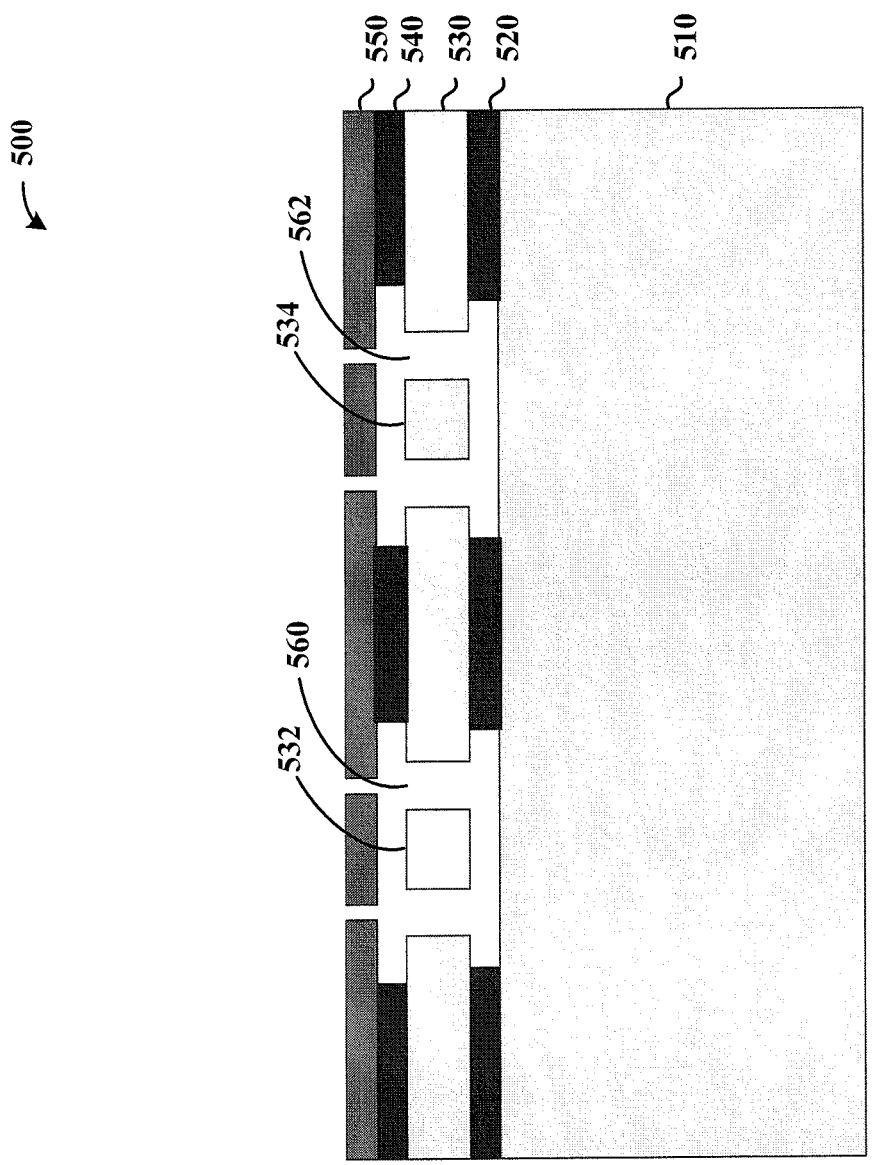

In FIG. 5C, a polysilicon encapsulation layer 550 is formed over the SiO$_2$ material 540, with etch openings 552, 554, 556 and 558 having been made in the polysilicon encapsulation layer. In FIG. 5D, sacrificial SiO$_2$ has been etched using an etch material such as HF vapor, using the etch openings 552-558 to access and etch SiO$_2$ around the resonator structures 532 and 534, resulting in open areas 560 and 562 respectively around the resonator beams.

Figure 5E:
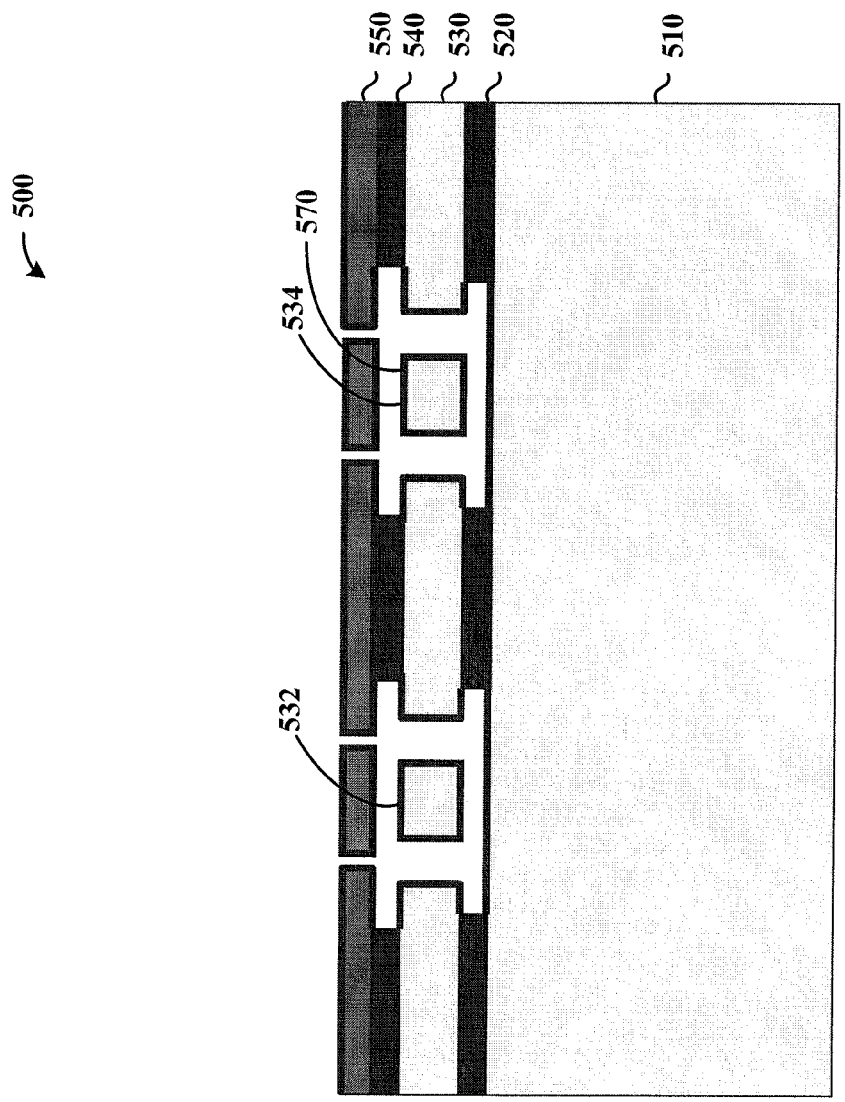
Figure 5F:
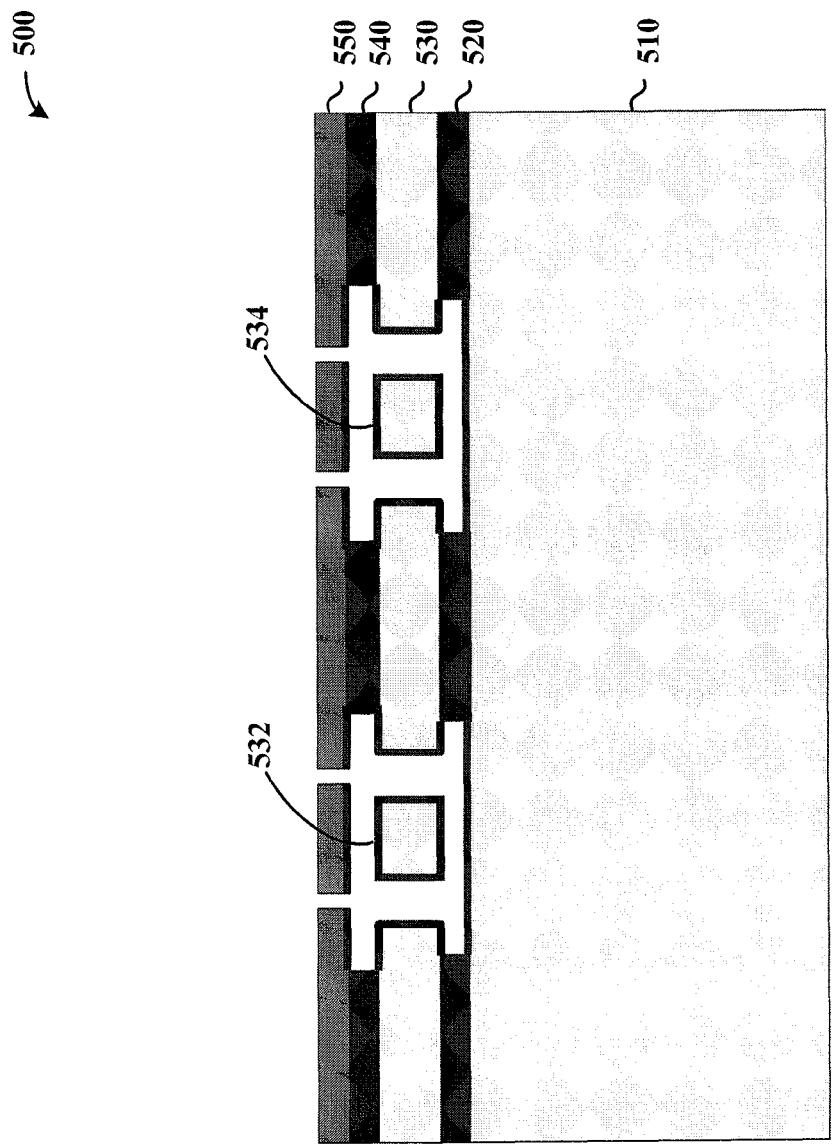

After the sacrificial SiO$_2$ has been etched, SiO$_2$ is grown on exposed surfaces as shown in FIG. 5E. The SiO$_2$ growth is achieved using, for example, a 30 minute wet oxidation at 1100° C., or at one or more of wet or dry applications at a variety of temperatures. The resonating structures 532 and 534 are oxidized, forming SiO$_2$ including SiO$_2$ 570 of resonator structure 534, referenced by way of example. The SiO$_2$ on the top surface of the polysilicon layer 550 is then etched, with the structure shown in FIG. 5F.

The size of the resonating structures 532 and 534, and the thickness of the SiO$_2$ 570, can be selected in accordance with one or more of the example embodiments discussed herein to achieve a desirable TCF and turnover temperature (TOT), where appropriate. For example, referring to FIG. 7 and its discussion below, each of the resonating structures 532 and 534 can be formed to a thickness that results in a TOT that is desirable for a particular operating environment.

Figure 5G:
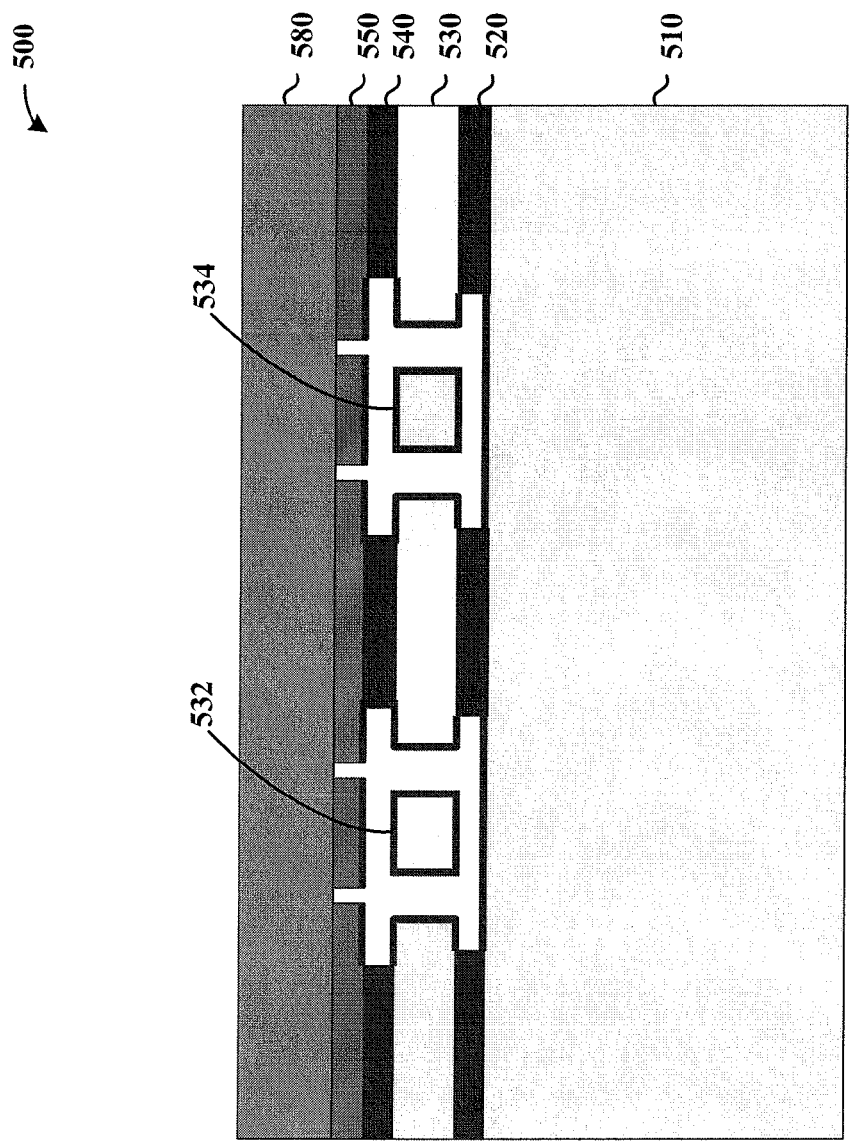

In FIG. 5G, an encapsulation layer 580 of polysilicon is formed on the polysilicon layer 550 to seal the structures 532 and 534. The area around each beam is selectively a vacuum, near-vacuum or includes a selected gas such as an inert gas or mixture of gasses. In some applications, the encapsulation layer 580 is formed of a material other than polysilicon, or in addition to polysilicon, such as an oxide or metal material, or another material formed using, for example, CVD.

In connection with certain embodiments, one or more heating or cooling elements are formed integrally with each resonator formed in the resonator arrangement 500 to control the operating temperature of the arrangement, and particularly of the resonating structures. For example, a heating or cooling element can be formed with the Silicon layer 530 and patterned accordingly, below the resultant resonating structures 532 and 534 in the silicon wafer 510, or above the resonating structures in the encapsulation layer 580.

Figure 5H:
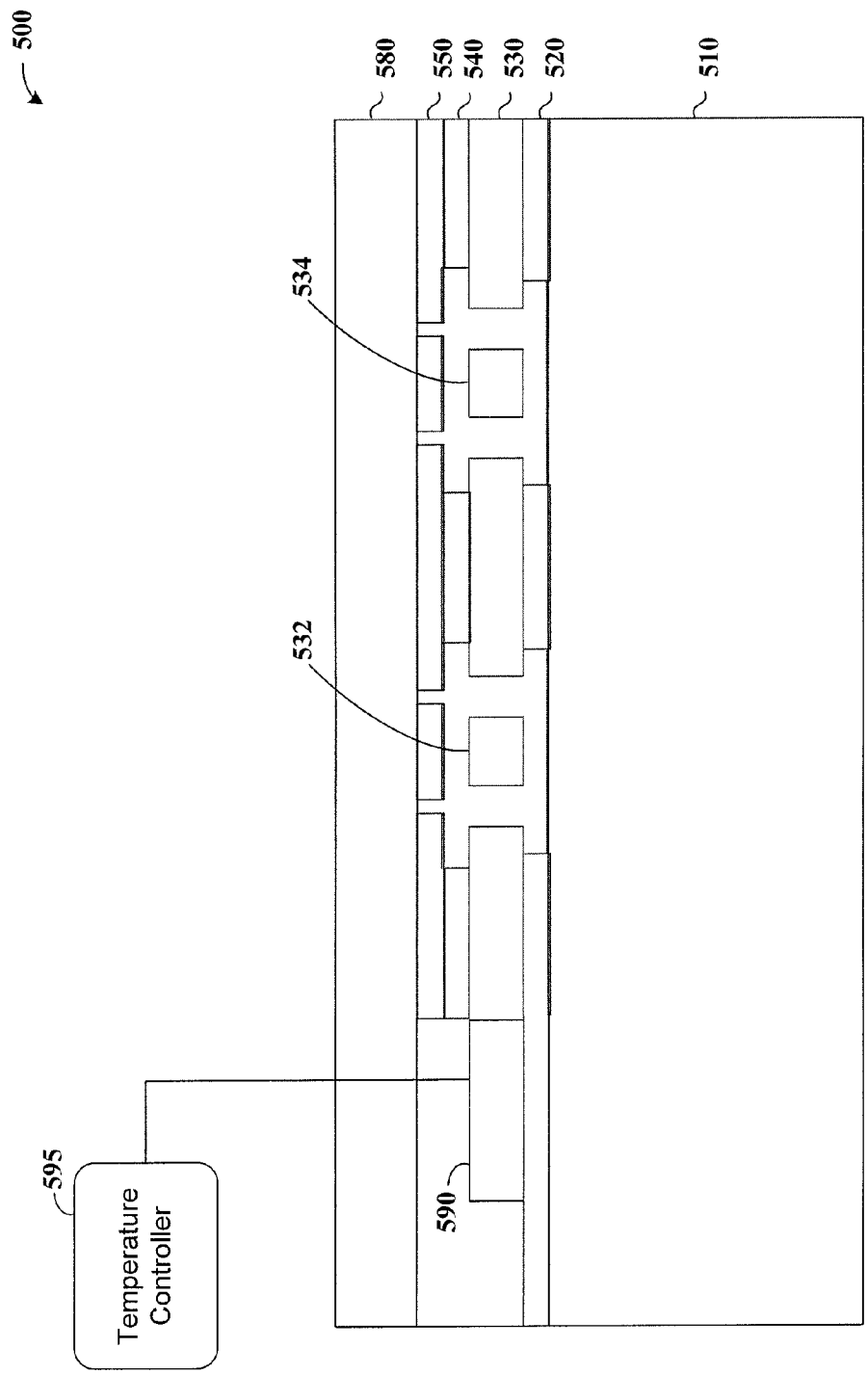
FIG. 5H shows a resonator arrangement with temperature control, according to another example embodiment of the present invention.

FIG. 5H shows an example embodiment involving temperature control, where an electric temperature-control device 590 has been formed during the manufacturing process steps shown in FIGS. 5A-5G. The temperature-control device 590 is electrically coupled to an external temperature controller 595, such as a computer, microprocessor or other control circuit for maintaining the temperature of the resonating structures 532 and 534. In some applications, the temperature-control device 590 also includes temperature sensing circuitry to sense the temperature of the resonating structures 532 and 534, and to provide feedback to the temperature controller 595 for use in controlling the temperature-control device. Using this approach, the temperature-control device 590 can be implemented as a heating or cooling element to respectively heat or cool the resonating structures 532 and 534 to a desired operating temperature or temperature range.

Used in connection with the manufacturing steps shown in FIGS. 5A-5G, the resonator arrangement 500 can be formed to exhibit a particular turnover temperature (TOT) that is maintained by the temperature-control device 590. For example, as described below in connection with FIG. 7, the Silicon 532 and 534, and the SiO$_2$ layer 570 formed thereon, can be formed to desired thickness in a manner similar to that shown in and discussed in connection with FIG. 7 to set a TOT for the resonator arrangement 500. The temperature-control device 590 and the temperature controller 595 maintain the resonating structures 532 and 534 at or near the set TOT for operation of the resonator arrangement 500.

While implemented for the manufacture of resonators as shown, the approaches discussed in connection with FIGS. 5A-5H are applicable to a variety of shapes, such as oval, square, circular, discs or other polygonal shapes that may be implemented in a variety of forms similar to or very different from beam-like shapes. In addition, while discussed as implemented with Silicon and SiO$_2$, the approaches shown in FIGS. 5A-5H are selectively implemented with other materials, respectively selected to facilitate a desirable TCF for structures 532 and 534.

Figure 6A:
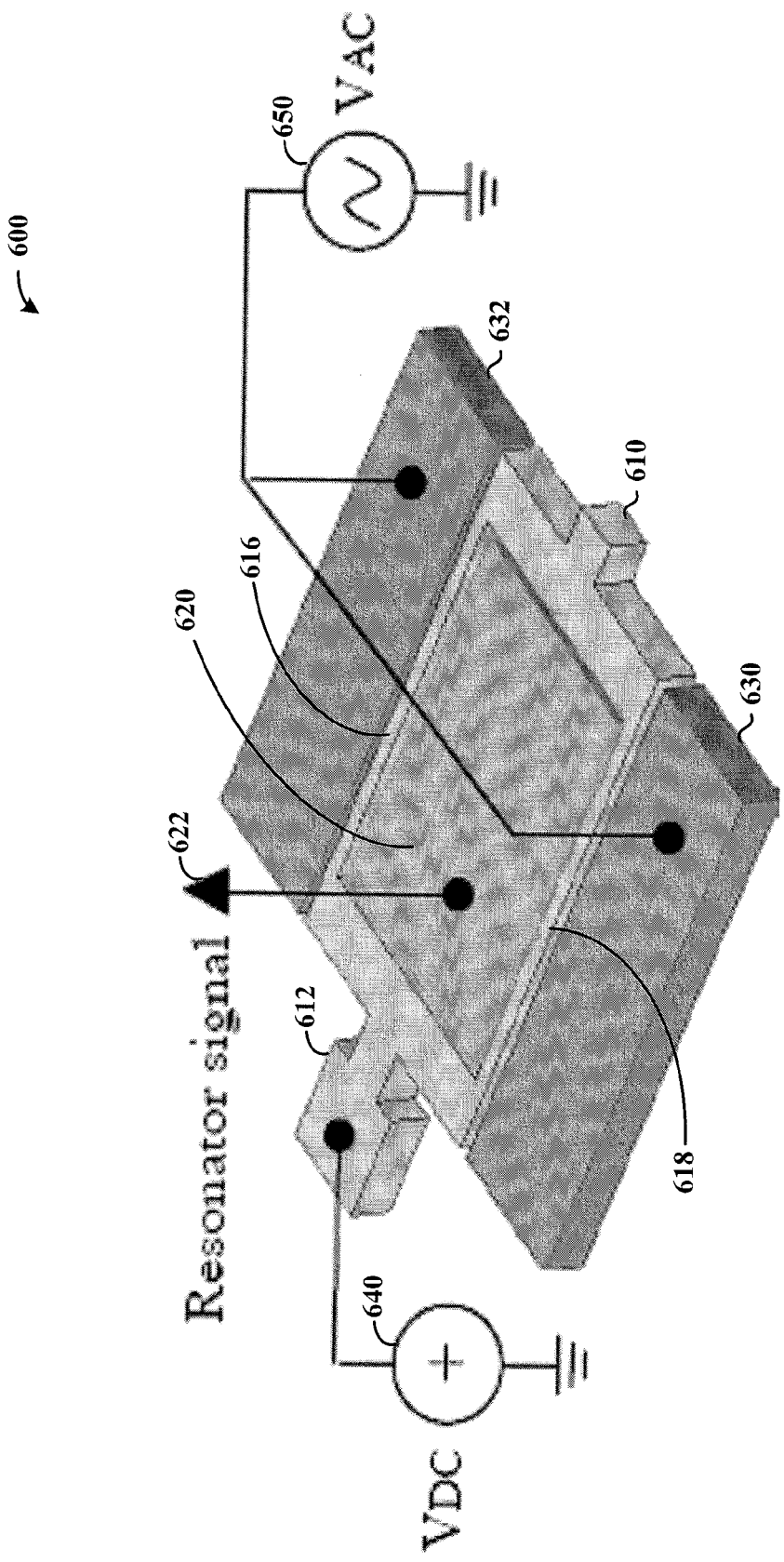
FIG. 6A shows a single-anchor, double-ended tuning fork resonator arrangement, according to another example embodiment of the present invention.

FIG. 6A shows a single-anchor, double-ended tuning fork (DETF) resonator arrangement 600 with outer excitation electrodes 630 and 632, and an inner sense electrode 620, according to another example embodiment of the present invention. The outer electrodes 630 and 632 are coupled to an AC voltage supply $V_{AC}$ 650, with the inner sense electrode 620 providing a resonator signal output 622.

The DETF resonator arrangement 600 includes a DETF having a free end 610 and a fixed end 612 separated by resonator structures 616 and 618. The fixed end 612 supports the DETF, is coupled to an underlying substrate (see, e.g., FIG. 6B) and electrically coupled to a voltage supply $V_{DC}$ 640. Resonator structures 616 and 618 are made up of a composite of at least two materials, such as shown with FIG. 2 or FIG. 3, such that the TCF is near zero and the resonator signal 622 for the DETF resonator arrangement 600 is generally consistent over a temperature range for a given input at $V_{AC}$ 650.

In some applications, an active temperature compensation approach is implemented with passive, TCF-based approaches as described herein, to facilitate the mitigation of temperature-based fluctuation in resonant frequency of the arrangement 600. In some applications, this approach involves applying an electrostatic force via an external electrode in proximity of the arrangement 600. For general information regarding the application of active temperature compensation, and for specific information regarding approaches to the application of an electrostatic force, reference may be made to U.S. Patent Publication No. 20050162239 (issued as U.S. Pat. No. 7,071,793) and to U.S. Pat. No. 6,987,432, both of which are fully incorporated herein by reference.

Figure 6B:
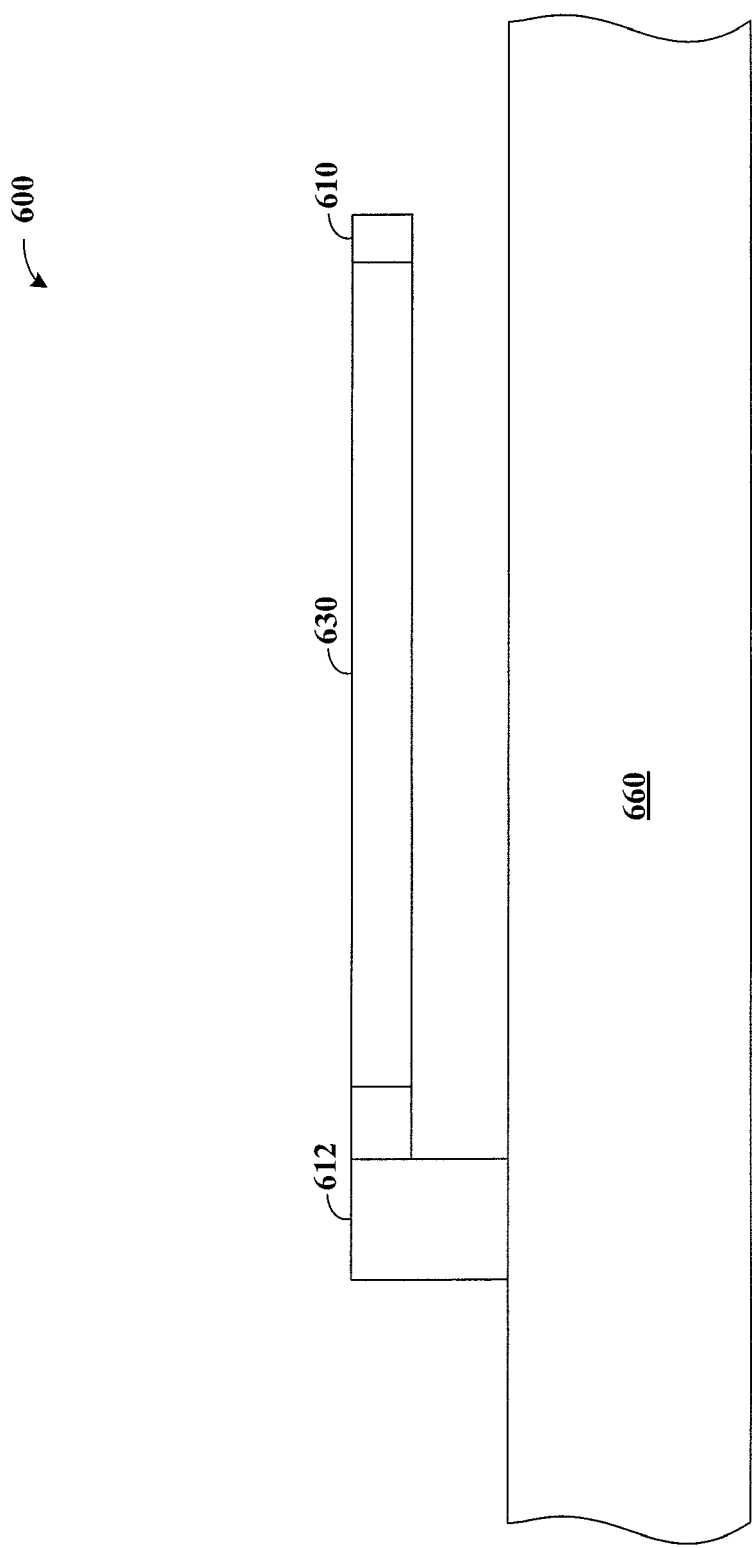
FIG. 6B shows a side view of the single-anchor, double-ended tuning fork resonator arrangement of FIG. 6A anchored to a substrate in accordance with another example embodiment of the present invention.

FIG. 6B shows a side view of the single-anchor, double-ended tuning fork resonator arrangement 600 of FIG. 6A anchored to a substrate 660, in accordance with another example embodiment of the present invention. The fixed end 612 is shown extended below the rest of the arrangement 600 shown in FIG. 6A, to the substrate 660 (e.g., a silicon substrate).

FIG. 7 shows plots of temperature versus frequency as applicable to resonators implemented and/or manufactured in accordance with one or more example embodiments of the present invention. The approaches shown in FIG. 7 are relevant to a variety of resonator arrangements. By way of example, the plots in FIG. 7 are discussed as implemented in connection with the resonator arrangement 200 shown in FIG. 2 and discussed above. In this regard, while the following discussion refers to the resonator arrangement 200, it is applicable to a variety of resonators having different compositions and arrangements.

The plots 710, 720, 730 and 740 represent temperature versus frequency change respectively for silicon resonator arrangements (as the arrangement 200) as the width of inner material 210 (using Si) is decreased while maintaining the thickness of the outer material layer 220 (using $SiO_2$). Specifically, the width of the inner material 210 is 5 μm in plot 710, 4.6 μm in plot 720, 4.4 μm in plot 730 and 4.2 μm in plot 730. In this regard, by changing the composition of the Si and SiO2 in the beam of the resonator, the turnover temperature is set.

In some embodiments, a single-anchored resonator such as that shown in FIG. 2 is formed with a combination of Si and $SiO_2$ material that mitigates and/or cancels the linear ($1^{st}$ order) temperature TCF response of the resonator over a particular temperature range, using a structure exhibiting a temperature response corresponding to one of the approaches shown in FIG. 7. Higher order temperature dependencies, relating to material or actuation nonlinearities, are used with the resonator to facilitate a resonator turnover temperature (TOT) or inflection temperature at the particular temperature range. At this temperature range (e.g., a small range near a peak exhibiting near-zero slope as shown in the plots 710-740), the frequency variation of the resonator is at or near zero.

In other embodiments, a resonator such as shown in FIG. 2 is structured to exhibit a TOT value that it is in a range desirable for a particular environment in which the resonator is to be used, in accordance with the combined effects of electrostatic operating conditions (if present) and $Si/SiO_2$ beam geometry. For example, a resonator can be structured to exhibit a TOT that is between expected operating temperatures for a particular implementation, thereby mitigating total frequency variation under these expected operating conditions. One such example involves a resonator used in a wristwatch or other device worn on the body, where the TOT of the resonator is set between room temperature and body temperature.

In certain high-precision applications such as timing applications, a silicon-based resonator arrangement includes a resonator and a temperature-control arrangement to maintain the resonator at or near a TOT set relative to expected operating temperatures. In one embodiment, the TOT of a silicon-based resonator such as shown in FIG. 2 can be set to a temperature that is elevated above a highest expected operating temperature. For operation, the resonator is heated to the TOT or to a range near the TOT over which the frequency response of the resonator is relatively flat. A heating element can be used to maintain the temperature of the resonator at the TOT regardless of changes in the ambient temperature. In another embodiment, a similar approach involves setting a TOT below a lowest expected operating temperature and employing a cooling element to cool the resonator to the TOT or to a range near the TOT. With these approaches, the silicon-based resonator is maintained at a temperature or temperature range over which the frequency response of the resonator is generally consistent.

In some applications, silicon-based resonators are manufactured for use in temperature-controlled applications such as in the high-precision applications described above, by incorporating temperature-controlling elements in the manufacturing process. For example, where a resonator is to be maintained at elevated temperatures, relative to the environment in which the resonator is operated, heating elements are formed with the silicon material used to form the resonator. This approach may involve, for example, forming electrical circuits and other components that generate heat in close proximity with the resonator. This approach can also be carried out in connection with a resonator encapsulation approach, where the resonator is encapsulated in a manner that also facilitates the delivery of heat to the resonator via circuitry that is internal to the silicon. With this approach, relatively low-power heating or cooling elements can be integrally manufactured with silicon-based resonators to maintain a desired resonator temperature.

The resultant TCF of resonators manufactured to facilitate a desirable TOT using these approaches can be reduced relative to single-material resonators such as Silicon resonators (e.g., reduced to less than −30 ppm/° C. that can be exhibited by Silicon resonators). This approach may be implemented in a manner similar, for example, to those discussed above with the $Si/SiO_2$ resonant structure 100 in FIG. 1 to mitigate or remove the linear, −30 ppm/° C. temperature dependence of silicon resonators at a particular temperature. By also controlling or setting the turnover temperature of a resonator, the resonator can be used in a broad range of applications, such as the high precision timing application discussed above.

Figure 8:
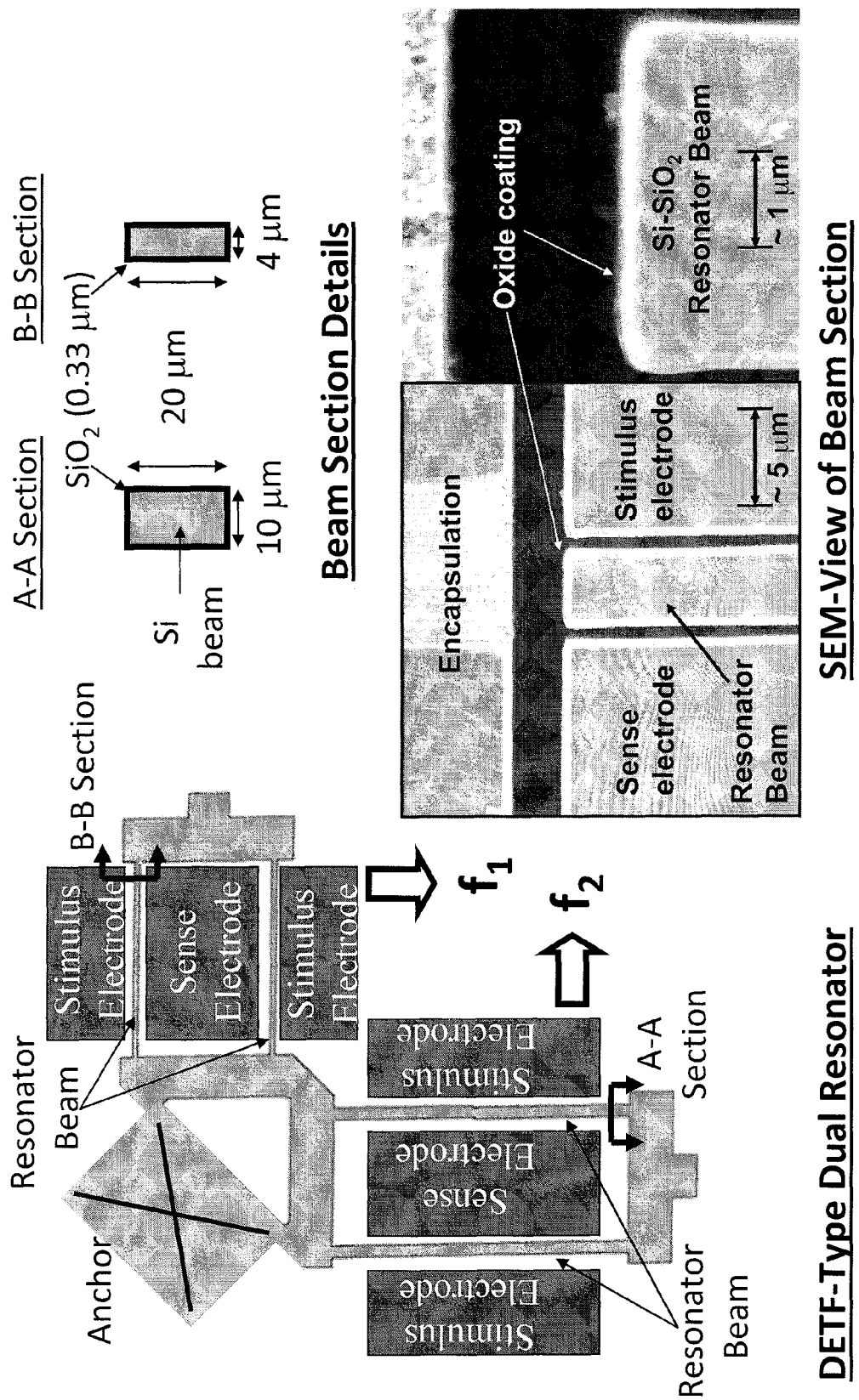
FIG. 8 shows a resonator arrangement according to another example embodiment of the present invention.

FIG. 8 shows a resonator arrangement, including two resonators, according to another example embodiment of the present invention. The resonators are DETF resonators coupled to one another and anchored using a single anchor. The resonators have respective cross-sections and arrangements as shown to facilitate selected resonant behavior. A scanning electron microscope (SEM) image of an example resonator having such characteristics is also shown.

Figure 9:
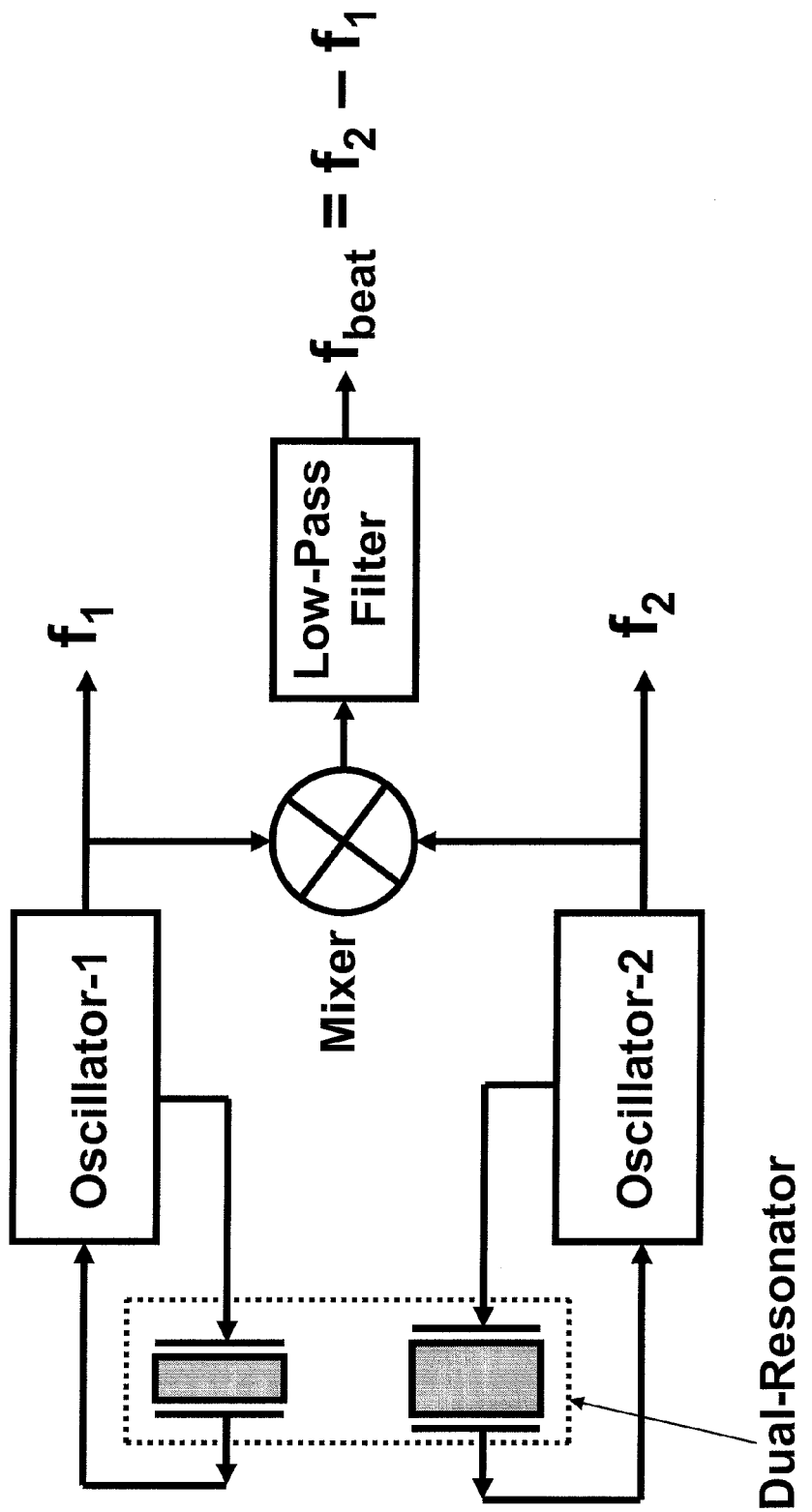
FIG. 9 shows a schematic circuit including two resonators, according to another example embodiment of the present invention.

FIG. 9 shows a schematic circuit including two resonators, according to another example embodiment of the present invention. Outputs ($f_1$, $f_2$) generated from the resonators are mixed and filtered to generate an output $f_{beat}$.

Figure 10:
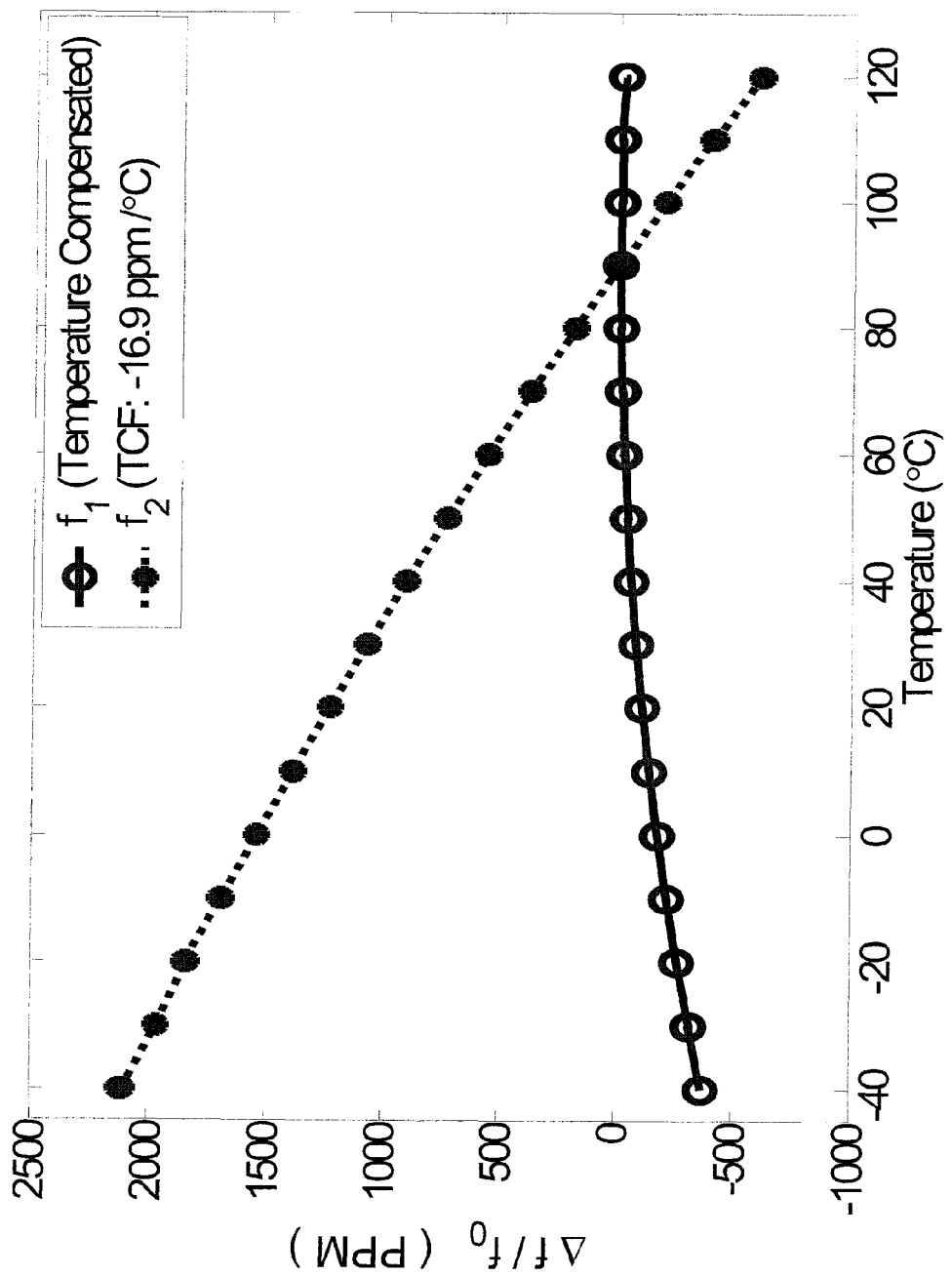
FIG. 10 shows a plot of temperature behavior for two resonators implemented in a common arrangement, according to another example embodiment of the present invention.

FIG. 10 shows a plot of temperature behavior, relative to frequency, for two resonators implemented in a common arrangement, according to another example embodiment of the present invention.

Figure 11:
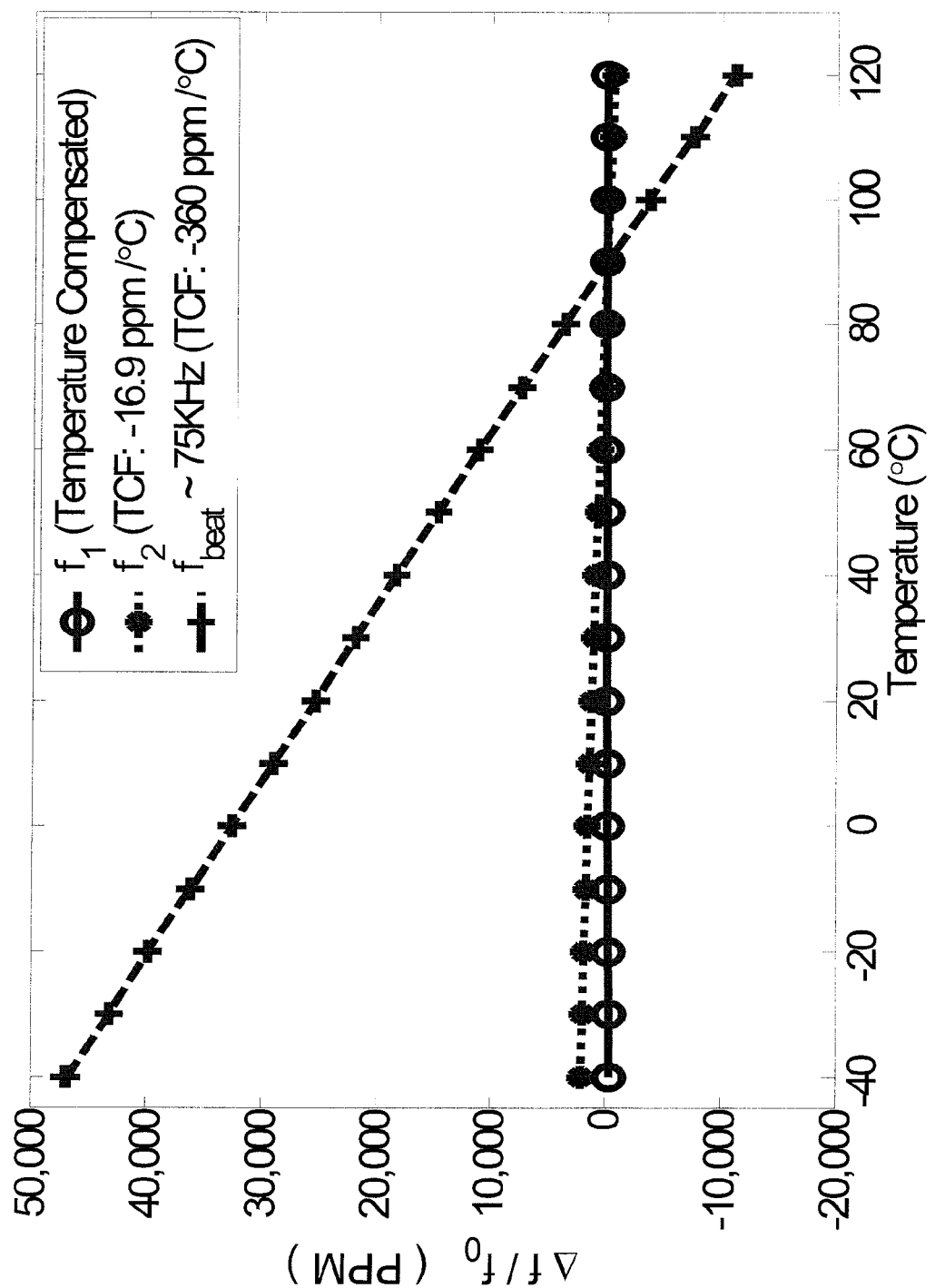
FIG. 11 shows plots of temperature behavior for resonators operating in a common environment, and a combined output from the resonators, according to another example embodiment of the present invention.

FIG. 11 shows plots of temperature behavior, relative to beat, for resonators operating in a common environment, and a combined output from the resonators, according to another example embodiment of the present invention.

The approaches shown and described in FIGS. 8-11 may be implemented in accordance with one or more of the following embodiments and discussions.

In some applications, a resonant device includes adjacent resonators with different TCF values. For example, a pair of resonators with different TCF can be used to determine the temperature of the device, as the difference in the frequency between the devices is a predictable and repeatable function of the temperature. Further, it is possible to use the two frequencies in various ways to produce measurements of both frequencies, which allows the temperature measurement to take place without the need for external frequency references. Example such resonators are shown in FIG. 8, and may be electrically connected as shown in FIG. 9 to produce outputs, such as shown in FIG. 10 and/or FIG. 11.

Another embodiment is directed to a pair of resonators, with one of the resonators having its TOT selected in a middle of the range of temperatures where the device would be used, such as room temperature, and the other of the resonators having a relatively large temperature coefficient in this same range (e.g., about 20 ppm/° C.). Each resonator has a resonance frequency of approximately 1 MHz at 20° C., where the difference frequency between the resonators is approximately zero at 20° C., and the resonators have a sensitivity of 20 Hz/° C. in this range. The first resonator is approximately temperature independent in this range and can be used as a reference for the measurement of the difference frequency.

Another example embodiment utilizes two resonators that have the same general core material shape, with one of the resonators scaled (i.e., proportionally) to be larger than the other. By suitable scaling of all dimensions, the resonator core beam dimensions (length, width) are larger in one resonator, relative to the other. In a fabrication process, the same thickness of $SiO_2$ is grown on all surfaces of both resonators, and that thickness can be chosen so that the first resonator has a TOT in the middle of a desired temperature range, while the second resonator has a large TCF through this range.

Signals from resonators described above (e.g., one with near-zero TCF, and one with large TCF) can be combined to achieve a temperature signal using a variety of approaches. For instance, one or more approaches for subtracting, dividing, multiplying and otherwise manipulating signals from Quartz crystal devices can be implemented with two such resonators. With these approaches, the resonances and TCFs of the resonances can be independently controlled, facilitating application-specific utilization of the signals produced using the devices.

In another example embodiment, a dual resonator arrangement is used to produce a temperature control signal, where the TOT of a first resonator is set at a temperature above an environmental range of operation of the device. A signal characterizing the temperature difference between the TOT of the first resonator and the temperature of the device can be produced and used (e.g., with a feedback loop) along with a heater to raise the temperature of the device to the TOT and to precisely control the temperature at that point. This temperature control is used to suppress frequency variations of the first resonator (e.g., in a manner similar to atomic clocks). In some applications, the heating and thermal isolation is implemented within a MEMS structure including the resonator and encapsulation of the resonator, providing a small, low-power, and inexpensive temperature-controlled reference.

The resonators described herein can be implemented in a variety of resonator arrangements, either passively or with additional controls relating to one or more of temperature and electrical stimulation. For example, some embodiments are directed to the use of such resonators without the application of electrical temperature-compensation during resonator operation. In addition, once the material type and related material dimensions and arrangement for a certain amount of compensation are known, resonator devices can be mass-produced (e.g., on a silicon wafer-scale) and operated without necessarily further calibrating the temperature response of the resonator.

While the present invention has been described with reference to several particular example embodiments, those skilled in the art will recognize that many changes may be made thereto without departing from the spirit and scope of the present invention. Such changes may include, for example, implementing approaches with the various resonant-type structures described above with other applications, such as pressure sensors, mechanical transducers and other frequency-reference devices. In addition, one or more of the various approaches described above may be applied to a resonator of construction other than Silicon (or silicon oxide), or of materials in addition to Silicon, or other Silicon-based materials. The approaches discussed herein are also selectively used with other temperature compensation arrangements and approaches, including both active and passive approaches, or approaches to mitigating frequency drift over time. Furthermore, the various structures shown may be fabricated and/or otherwise arranged in an array, with a plurality of structures used for a particular application. In addition, the structures are compatible with encapsulation in a hermetic cavity to facilitate stability. These and other approaches as described in the following claims characterize aspects of the present invention.

What is claimed is:

1. A mechanical transducer arrangement comprising:
   a substrate;
   a pair of composite structures, each structure including first and second materials arranged as a function of their respective TCE (temperature coefficient of Young's Modulus) values to set a turnover temperature (TOT) of the composite structure, the respective composite structures having first and second materials arranged as a function of their respective TCEs to set different TOTs, the second materials of the respective structures being of the same thickness; and
   for each composite structure, an anchor configured to secure the composite structure to the substrate at a single location and configured to permit at least one other location thereof to remain nonanchored for mitigating coupling of stresses into the composite structure.

2. The arrangement of claim 1, wherein the first and second materials of at least one of the composite structures are arranged to set a TCF (temperature coefficient of frequency) that is consistent over a temperature range including the TOT of the at least one of the composite structures.

3. The arrangement of claim 1, wherein the first and second materials of at least one of the composite structures are arranged to set a frequency response that is about zero for temperatures in a temperature range including the TOT of the at least one of the composite structures.

4. The arrangement of claim 1, wherein the first and second materials of at least one of the composite structures are arranged to set a consistent mechanical stiffness of the composite structure over a temperature range including the TOT of the at least one of the composite structures.

5. The arrangement of claim 1, wherein the first and second materials of at least one of the composite structures are arranged to mitigate fluctuation in mechanical stiffness of the composite structure over a temperature range including the TOT of the at least one of the composite structures, relative to a fluctuation in mechanical stiffness of the first material over said temperature range.

6. The arrangement of claim 1, wherein at least one of the composite structures exhibits a frequency change with respect to temperature having an absolute value that
   approaches zero as the temperature of the structure approaches the TOT,
   remains at about zero over a small temperature range that includes the TOT, and
   increases beyond zero as the temperature of the structure increases beyond the TOT.

7. The arrangement of claim 1, further including a temperature-controlling device to maintain the each of the composite structures at a temperature that is about equal to the TOT of the respective structures.

8. The arrangement of claim 1, wherein at least one of the composite structures consists of the first and second materials.

9. A mechanical transducer arrangement comprising:
   a substrate;
   at least two composite structures, each structure including first and second materials arranged as a function of their respective TCE (temperature coefficient of Young's Modulus) values to set a selected turnover temperature (TOT) of the composite structure and to mitigate fluctuation in mechanical stiffness of the composite structure over a temperature range including the TOT, relative to a fluctuation in mechanical stiffness of the first material over said temperature range, the first materials of the respective composite structures being arranged differently to set different selected TOTs; and
   an anchor configured to secure the composite structure to the substrate at a single location and configured to permit at least one other location thereof to remain nonanchored for mitigating coupling of stresses into the composite structure.

10. The arrangement of claim 9, further including a heating element for at least one of the composite structures to heat the composite structure to a temperature that is about equal to the TOT.

11. The arrangement of claim 9, further including an electrostatic circuit for at least one of the composite structures to apply an electrostatic charge to the composite structure to mitigate fluctuation in mechanical stiffness.

12. The arrangement of claim 9, wherein at least one of the composite structures exhibits a TCF of a set value over an operating temperature range of the mechanical transducer.

13. The arrangement of claim 9, wherein at least one of the composite structures consists of the first and second materials.

14. An encapsulated resonator arrangement comprising:
   a substrate;
   at least two a composite resonant structures, each structure extending over the substrate and including
      a structural material susceptible to temperature-related fluctuation in resonant frequency, and
      a compensation material grown on an outer surface of the structural material and having a TCE, shape and thickness, relative to the structural material and its shape, to set a selected turnover temperature (TOT) of the composite resonant structure and to passively mitigate the temperature-related fluctuation in resonant frequency in the composite resonant structure over a temperature range including the TOT, the compensation material for each composite resonant structure being of the same thickness and the TOT of each respective composite resonant structure being different;
   a support structure configured to secure the composite resonant structure to the substrate at a single location and configured to permit at least one other location thereof to remain nonanchored for mitigating coupling of stresses into the composite structure;
   sidewall material on the substrate and laterally adjacent the composite resonant structure; and
   an encapsulation material over the composite resonant structure and, with the substrate and sidewall material, encapsulating the composite resonant structure.

15. The arrangement of claim 14, wherein the structural and compensation materials of at least one of the composite resonant structures are arranged to set a TCF (temperature coefficient of frequency) of the composite resonant structure that is consistent over a temperature range including the TOT.

16. The arrangement of claim 14, wherein the structural and compensation materials of at least one of the composite resonant structures are arranged to facilitate a consistent mechanical stiffness of the composite structure over a temperature range including the TOT.

17. The arrangement of claim 14, further including a temperature control circuit to control the temperature of at least one of the composite resonant structures within a range of temperatures including the TOT of the structure.

18. An encapsulated resonator arrangement comprising:
   a resonant structure comprising substantially parallel beams of structural and compensation materials each having a composition, shape and respective TCE, arranged relative to one another, to set a selected turnover temperature (TOT) of the resonant structure and to passively mitigate temperature-related fluctuation in resonant frequency over a temperature range including the TOT, the beams being fixed at one end and extending cantilevered to a free end;
   a substrate underlying the resonant structure;
   an anchor configured to secure the resonant structure to the underlying substrate at a single location and configured to permit the free end of the beams to remain nonanchored for mitigating coupling of stresses into the composite structure;
   sidewalls including electrodes over the substrate and laterally adjacent to resonant structure;
   an encapsulation layer over the resonant structure, the encapsulation layer, sidewalls and substrate encapsulating the resonant structure;
   an electrical circuit to apply an electrostatic charge to the resonant structure via the sidewall electrodes; and
   wherein the resonant structure responds to the electrostatic charge by resonating at a resonant frequency that is substantially consistent over an operational temperature range of the resonator arrangement, the temperature range including the TOT.

19. A method for manufacturing a mechanical transducer arrangement, the method comprising:

forming a pair of composite structures by forming structural material over and anchored to a substrate at a single location and configured to permit at least one other location thereof to remain nonanchored for mitigating coupling of stresses into the composite structure, the structural material of the respective composite structures being different from one another and being susceptible to temperature-related fluctuation in mechanical stiffness, and forming a compensation material coupled to the structural material, for each composite structure, the compensation material and the structural material having respective TCE, shape and arrangement to set a selected turnover temperature (TOT) of the composite structure and to passively mitigate the temperature-related fluctuation in mechanical stiffness exhibited by the structural material, the TOTs of each composite structure being different; and encapsulating the composite structure.

20. The method of claim 19, wherein, for each composite structure, the steps of forming the structural and compensation materials include selecting the composition, shape and quantity of compensation material having a TCE that is opposite in sign from the TCE of the structural material, and arranging the compensation material in shape and quantity, relative to the structural material, to form the composite structure consisting of the structural material and the compensation material and that exhibits a selected TOT.

21. A mechanical transducer arrangement comprising:

a substrate;

a first composite structure having a pair of substantially parallel beams extending cantilevered over the substrate, the structure being anchored to the substrate at a single location to support a fixed end of the beams and configured to permit a free cantilevered end of the beams to remain nonanchored for mitigating coupling of stresses into the composite structure, and including at least two materials arranged as a function of their respective TCE (temperature coefficient of Young's Modulus) values to set a turnover temperature (TOT) of the composite structure; and a second composite structure anchored to the substrate at a single location and including at least two materials arranged as a function of their respective TCE (temperature coefficient of Young's Modulus) values to set a turnover temperature (TOT) of the second composite structure that is different than the TOT of the first composite structure.

22. The arrangement of claim 21, further including a circuit to generate, for each of the composite structures, an electrical output indicative of the frequency of the structure, and a circuit to use the outputs to generate a signal that is indicative of a temperature of the mechanical transducer arrangement.

23. The arrangement of claim 21, wherein the TOT of the first composite structure is in the middle of a particular temperature range, and the second composite structure has a TCF that is at least about 10% larger than the TCF of the first composite structure, at temperatures in the particular temperature range.

24. A resonator arrangement comprising:

a substrate;

an elongated composite resonant structure including substantially parallel beams that extend cantilevered over the substrate from a fixed end to a free end, each of the beams including a structural material susceptible to temperature-related fluctuation in resonant frequency, and compensation material grown on an outer surface of the structural material and having a TCE and thickness, relative to the structural material, to passively mitigate the temperature-related fluctuation in resonant frequency in the composite resonant structure;

a support structure coupling the elongated composite resonant structure at the fixed end of the beams to the substrate at a single location to solely support the composite resonant structure, the free end of the beams extending away from the support structure and cantilevered over the substrate;

sidewall material on the substrate and laterally adjacent the composite resonant structure, and an encapsulation material over the composite resonant structure and, with the substrate and sidewall material, encapsulating the composite resonant structure.

25. The arrangement of claim 24, wherein the free ends of the beams extend unsupported over the substrate to resonate independently from one another.

26. The arrangement of claim 24, further including an end piece that connects the free ends of the beams to one another.

27. A resonator arrangement comprising:

a substrate;

at least two elongated composite resonant structures respectively including substantially parallel beams that extend cantilevered over the substrate from a fixed end to a free end, each of the beams including a structural material susceptible to temperature-related fluctuation in resonant frequency, the structural material of one of the composite resonant structures having a different shape than the structural material of another one of the composite resonant structures, and compensation material grown on an outer surface of the structural material and having a TCE and thickness, relative to the structural material, to passively mitigate the temperature-related fluctuation in resonant frequency in the composite resonant structure over a temperature range that is different for said one of the composite resonant structures, relative to the other one of the composite resonant structures; and a support structure coupling the elongated composite resonant structure at the fixed end of the beams to the substrate at a single location to solely support the composite resonant structure, the free end of the beams extending away from the support structure and cantilevered over the substrate.

28. The arrangement of claim 27, wherein the free ends of the beams of at least one of the composite resonant structures extend unsupported over the substrate to resonate independently from one another.

29. The arrangement of claim 27, further including an end piece that connects the free ends of the beams to one another of at least one of the composite resonant structures.

30. The arrangement of claim 27, further including, sidewall material on the substrate and laterally adjacent the composite resonant structures, and an encapsulation material over the composite resonant structures and, with the substrate and sidewall material, encapsulating the composite resonant structures.

* * * * *